US011719527B2

(12) United States Patent
Lassalle-Balier

(10) Patent No.: US 11,719,527 B2
(45) Date of Patent: Aug. 8, 2023

(54) ANGLE SENSOR WITH A SINGLE DIE USING A SINGLE TARGET

(71) Applicant: Allegro MicroSystems, LLC, Manchester, NH (US)

(72) Inventor: Rémy Lassalle-Balier, Bures sur Yvette (FR)

(73) Assignee: Allegro MicroSystems, LLC, Manchester, NH (US)

( * ) Notice: Subject to any disclaimer, the term of this patent is extended or adjusted under 35 U.S.C. 154(b) by 28 days.

(21) Appl. No.: 17/453,577

(22) Filed: Nov. 4, 2021

(65) Prior Publication Data

US 2023/0134025 A1 May 4, 2023

(51) Int. Cl.
*G01B 7/30* (2006.01)
*G01D 5/14* (2006.01)
*G01R 33/07* (2006.01)

(52) U.S. Cl.
CPC ............ *G01B 7/30* (2013.01); *G01D 5/142* (2013.01); *G01R 33/077* (2013.01)

(58) Field of Classification Search
CPC .......... G01B 7/30; G01D 5/142; G01D 5/145; G01R 33/077; G01R 33/0094; G01R 33/02; G01R 33/025; G01R 33/072; G01R 33/09; G01R 33/091; G01R 33/093; G01R 33/096; G01R 33/098
See application file for complete search history.

(56) References Cited

U.S. PATENT DOCUMENTS

| 4,757,244 A * | 7/1988 | Iwamoto .............. G01B 7/003 318/653 |
| 5,781,005 A | 7/1998 | Vig et al. |
| 9,664,748 B2 | 5/2017 | Friedrich et al. |
| 10,746,820 B2 | 8/2020 | Lassalle-Balier et al. |
| 10,777,345 B2 | 9/2020 | Lassalle-Balier et al. |
| 10,816,366 B2 | 10/2020 | Weiland et al. |
| 10,837,753 B2 | 11/2020 | Lassalle-Balier et al. |
| 10,866,122 B2 | 12/2020 | Weiland et al. |

(Continued)

OTHER PUBLICATIONS

U.S. Appl. No. 17/112,107, filed Dec. 4, 2020, Deligiannis et al.

(Continued)

*Primary Examiner* — Steven L Yeninas
(74) *Attorney, Agent, or Firm* — Daly, Crowley, Mofford & Durkee, LLP

(57) ABSTRACT

In one aspect, an angle sensor includes magnetic-field sensing elements that include a first pair, a second pair, a third pair and a fourth pair of magnetic-field sensing elements; and processing circuitry configured to determine an angle of a rotating ring magnetic having a plurality of North-South pole pairs each having a unique period length. The processing circuitry includes a first bridge formed from the first and second pairs of magnetic-field sensing elements and a second bridge formed from the third and fourth pairs of magnetic-field sensing elements. The angle includes a value from 0° to 360°. The first, second, third and fourth pairs of magnetic-field sensing elements are each disposed on a first axis. The first, second, third and fourth pairs of magnetic-field sensing elements each have a sensitivity in a first direction along the first axis. The angle sensor is formed on a single die.

22 Claims, 23 Drawing Sheets

(56) References Cited

U.S. PATENT DOCUMENTS

| | | | |
|---|---|---|---|
| 10,866,287 B1 | 12/2020 | Lassalle-Balier et al. | |
| 10,921,391 B2 | 2/2021 | Cadugan et al. | |
| 11,175,359 B2 | 11/2021 | Lassalle-Balier et al. | |
| 2003/0173955 A1* | 9/2003 | Uenoyama | G01D 5/24476 324/252 |
| 2009/0284252 A1* | 11/2009 | Burgdorf | G01D 5/2451 324/207.2 |
| 2010/0141244 A1* | 6/2010 | Bartos | G01D 5/12 324/207.21 |
| 2013/0021027 A1* | 1/2013 | Ausserlechner | G01R 33/075 324/251 |
| 2015/0192432 A1* | 7/2015 | Noguchi | G01D 5/145 324/207.2 |
| 2016/0076914 A1* | 3/2016 | Gotz | G01D 5/248 702/150 |
| 2017/0268864 A1* | 9/2017 | Deak | G01D 5/14 |
| 2017/0356764 A1* | 12/2017 | Deak | G01D 3/08 |
| 2018/0052208 A1* | 2/2018 | Onaka | G01D 5/145 |
| 2019/0018082 A1* | 1/2019 | Lee | G01D 5/16 |
| 2019/0368858 A1* | 12/2019 | Deak | G01R 33/0052 |
| 2020/0041310 A1* | 2/2020 | Lassalle-Balier | G01R 33/0094 |
| 2020/0041583 A1* | 2/2020 | Cadugan | G01R 33/0094 |
| 2021/0011096 A1 | 1/2021 | Lassalle-Balier et al. | |
| 2021/0011097 A1 | 1/2021 | David et al. | |
| 2021/0148734 A1* | 5/2021 | Foletto | G01D 5/24485 |
| 2021/0293907 A1 | 9/2021 | Lassalle-Balier et al. | |
| 2021/0293910 A1 | 9/2021 | Lassalle-Balier et al. | |
| 2022/0003572 A1 | 1/2022 | Stewart | |

OTHER PUBLICATIONS

U.S. Appl. No. 17/374,219, filed Jul. 13, 2021, Ostermann et al.
U.S. Appl. No. 17/502,391, filed Oct. 15, 2021, Lassalle-Balier et al.
U.S. Appl. No. 17/647,350, filed Jan. 7, 2022, Lassalle-Balier et al.
Dwyer, "Ring Magnet Speed Sensing for Electronic Power Steering;" Allegro MicroSystems, LLC Product Information Data Sheet 296061-AN; Jan. 2009; 4 Pages.
Wood, "Motor Drive Discrete MOSFET Bridge Circuit Design and Layout;" Allegro MicroSystems, LLC Application Information Data Sheet AN296215; Initial Release Nov. 19, 2020; 6 Pages.

\* cited by examiner

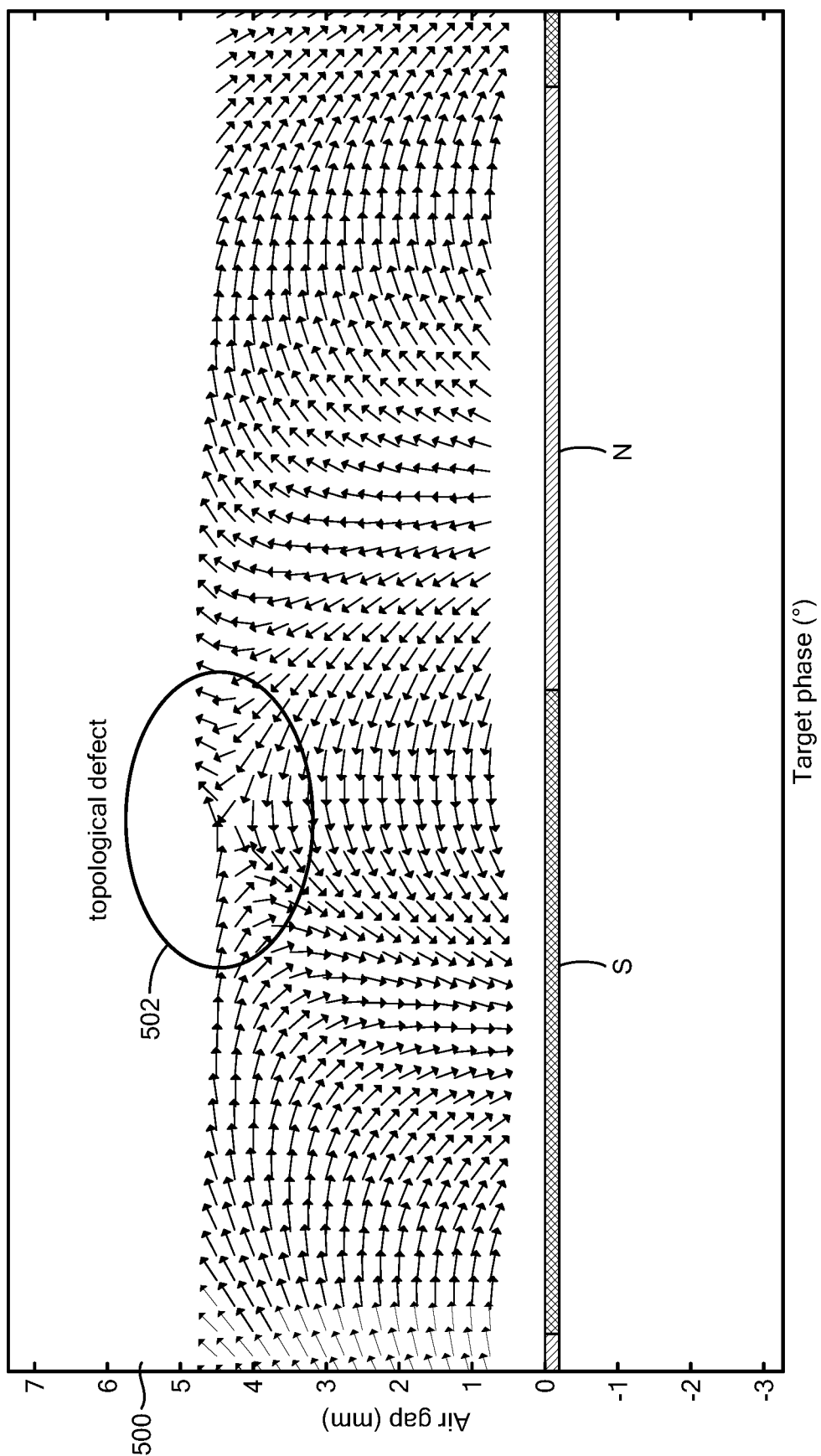

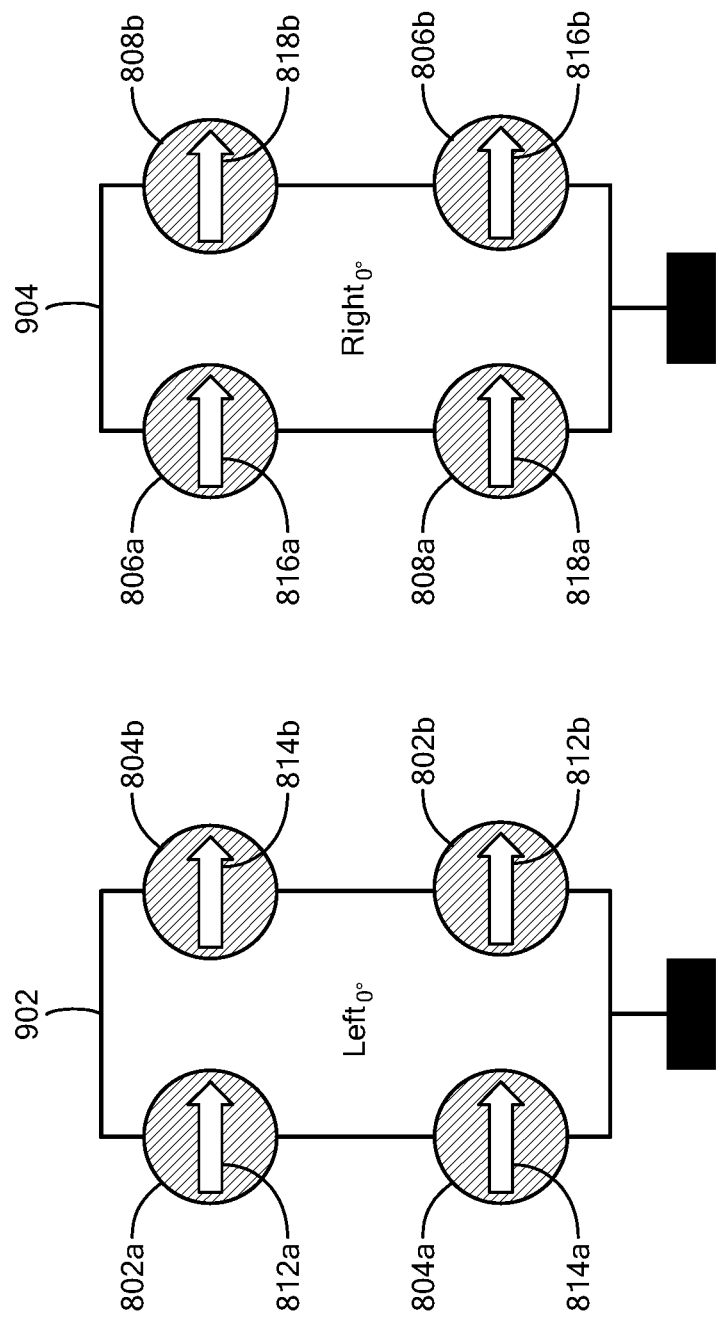

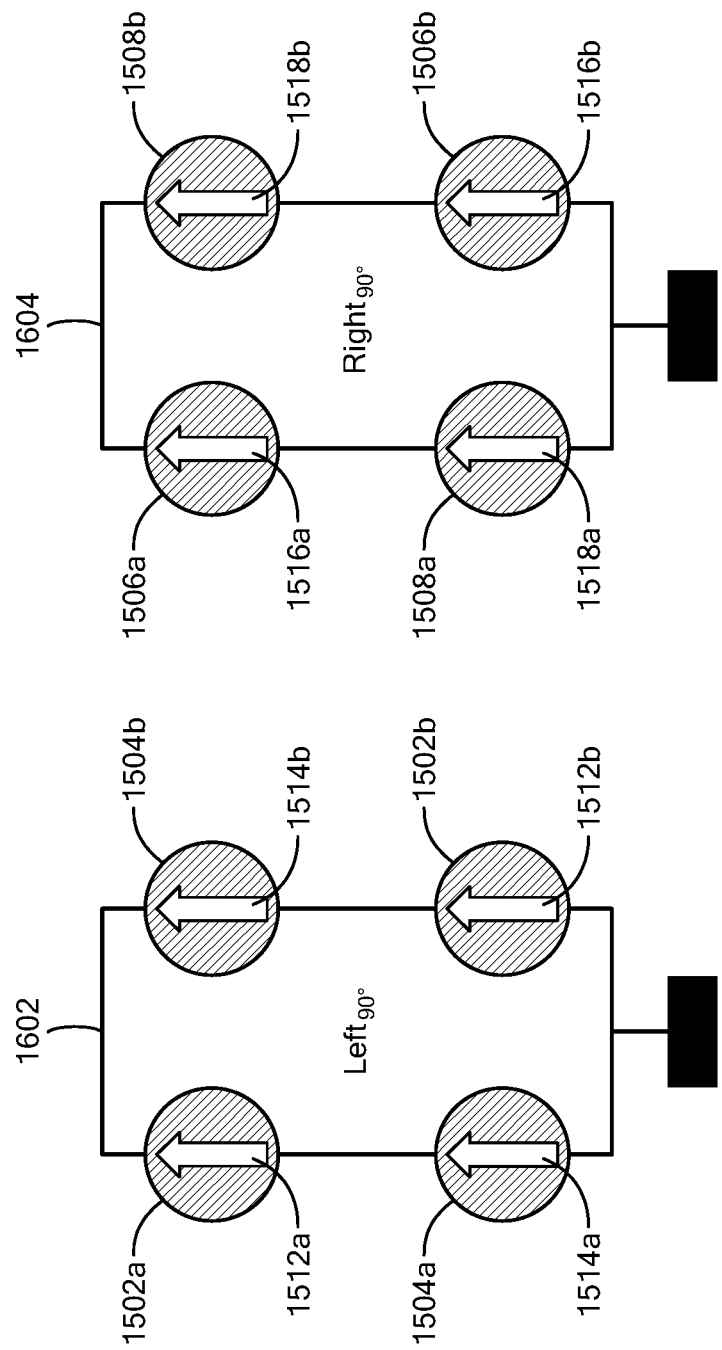

ANGLE SENSOR WITH A SINGLE DIE USING A SINGLE TARGET

BACKGROUND

Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

SUMMARY

In one aspect, an angle sensor includes magnetic-field sensing elements that include a first pair of magnetic-field sensing elements, a second pair of magnetic-field sensing elements; a third pair of magnetic-field sensing elements; and a fourth pair of magnetic-field sensing elements; and processing circuitry configured to determine an angle of a rotating ring magnetic having a plurality of North-South pole pairs each having a unique period length. The processing circuitry includes a first bridge formed from the first and second pairs of magnetic-field sensing elements and a second bridge formed from the third and fourth pairs of magnetic-field sensing elements. The angle includes a value from 0° to 360°. The first, second, third and fourth pairs of magnetic-field sensing elements are each disposed on a first axis. The first, second, third and fourth pairs of magnetic-field sensing elements each have a sensitivity in a first direction along the first axis. The angle sensor is formed on a single die. The angle sensor is an off-axis angle sensor or a side-shaft angle sensor.

In another aspect, an angle sensor system includes a ring magnet having a plurality of North-South pole pairs each having a unique period length and an angle sensor. The angle sensor includes magnetic-field sensing elements that includes a first pair of magnetic-field sensing elements, a second pair of magnetic-field sensing elements, a third pair of magnetic-field sensing elements, a fourth pair of magnetic-field sensing elements; and processing circuitry configured to determine an angle of the ring magnet. The processing circuitry includes a first bridge formed from the first and second pairs of magnetic-field sensing elements and a second bridge formed from the third and fourth pairs of magnetic-field sensing elements. The angle includes a value from 0° to 360°. The first, second, third and fourth pairs of magnetic-field sensing elements are each disposed on a first axis. The first, second, third and fourth pairs of magnetic-field sensing elements each have a sensitivity in a first direction along the first axis. The angle sensor is formed on a single die. The angle sensor is an off-axis angle sensor or a side-shaft angle sensor.

In a further aspect, a ring magnet includes a plurality of North-South pole pairs and each of the North-South pole pairs have a unique period length.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 5 is a graph of a magnetic-field map depicting an example of a topological defect;

FIGS. 9A and 9B are diagrams of examples of a left bridge and a right bridge respectively using the four pairs of magnetic-field sensing elements of FIG. 8;

FIGS. 16A and 16B are diagrams of examples of two additional bridges using the four additional pairs of magnetic-field sensing elements of FIG. 15;

DETAIL DESCRIPTION

Described herein are techniques to fabricate an angle sensor with a single die that can determine an angle using a single target. In one example, the single target is a ring magnet having North-South pole pairs each having a unique period length. In one example, the angle sensor is an off-axis angle sensor. In another example, the angle sensor is a side-shaft angle sensor.

Figure 1:
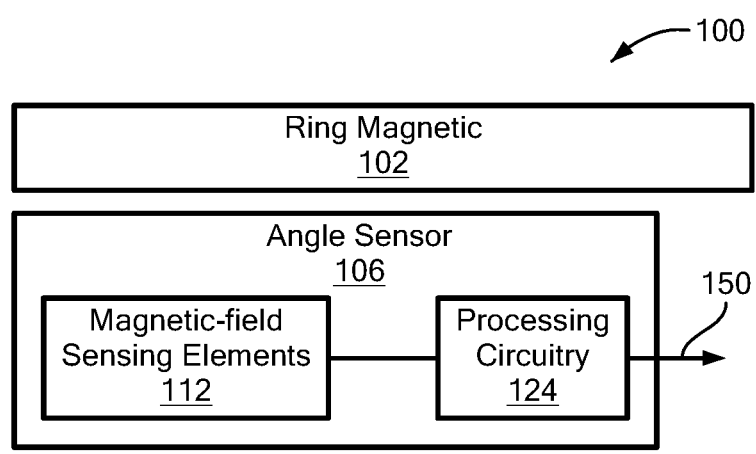
FIG. 1 is a diagram of an angle sensor system.

Referring to FIG. 1, an example of an angle sensor is an angle system 100. The angle system 100 includes a ring magnetic 102 and an angle sensor 106. In one example, the ring magnet 102 is a ring magnet with a plurality North- South pole pairs. In one example, the angle sensor 106 is an off-axis angle sensor. In another example, the angle sensor 106 is a side-shaft angle sensor.

The angle sensor 106 includes magnetic-field sensing elements 112 and processing circuitry 124. The magnetic-field sensing elements 112 detects changes in a magnetic field caused by the rotating ring magnet 102 and provides signals indicative of the changes in the magnetic-field to the processing circuitry 124. Based on the signals from the magnetic-field sensing elements 112, the processing circuitry 124 determines an angle of the ring magnet 102 and provides the angle of the ring magnet 102 in an output signal 150.

In one example, the magnetic-field sensing elements 112 may include vertical Hall elements, horizontal Hall elements and/or magnetoresistance elements. Magnetoresistance elements may include a giant magnetoresistance (GMR) element and/or a tunneling magnetoresistance (TMR) element.

Figure 2A:
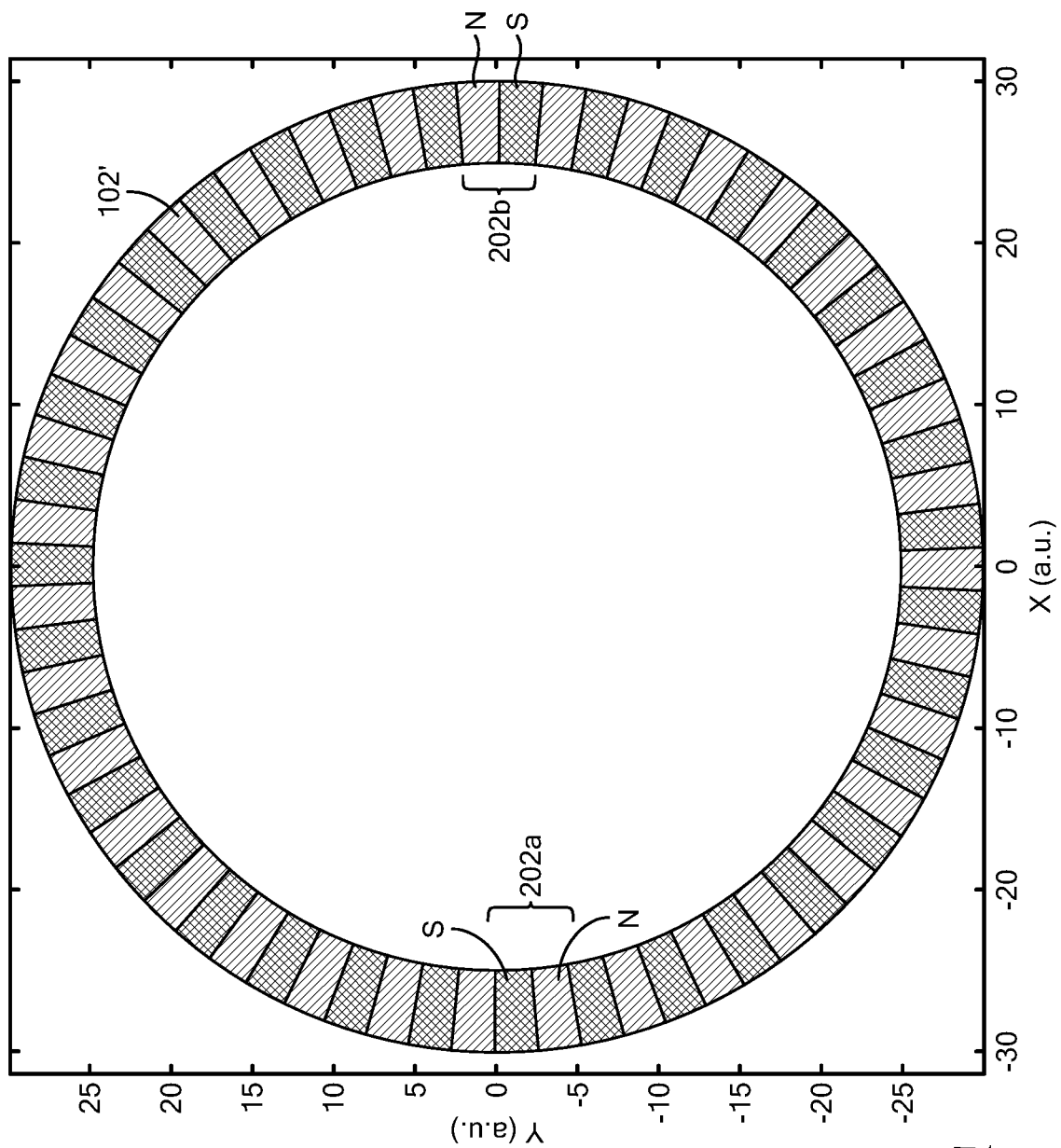
FIG. 2A is a diagram of an example of a ring magnet of the angle sensor system of FIG. 1.
Figure 2B:
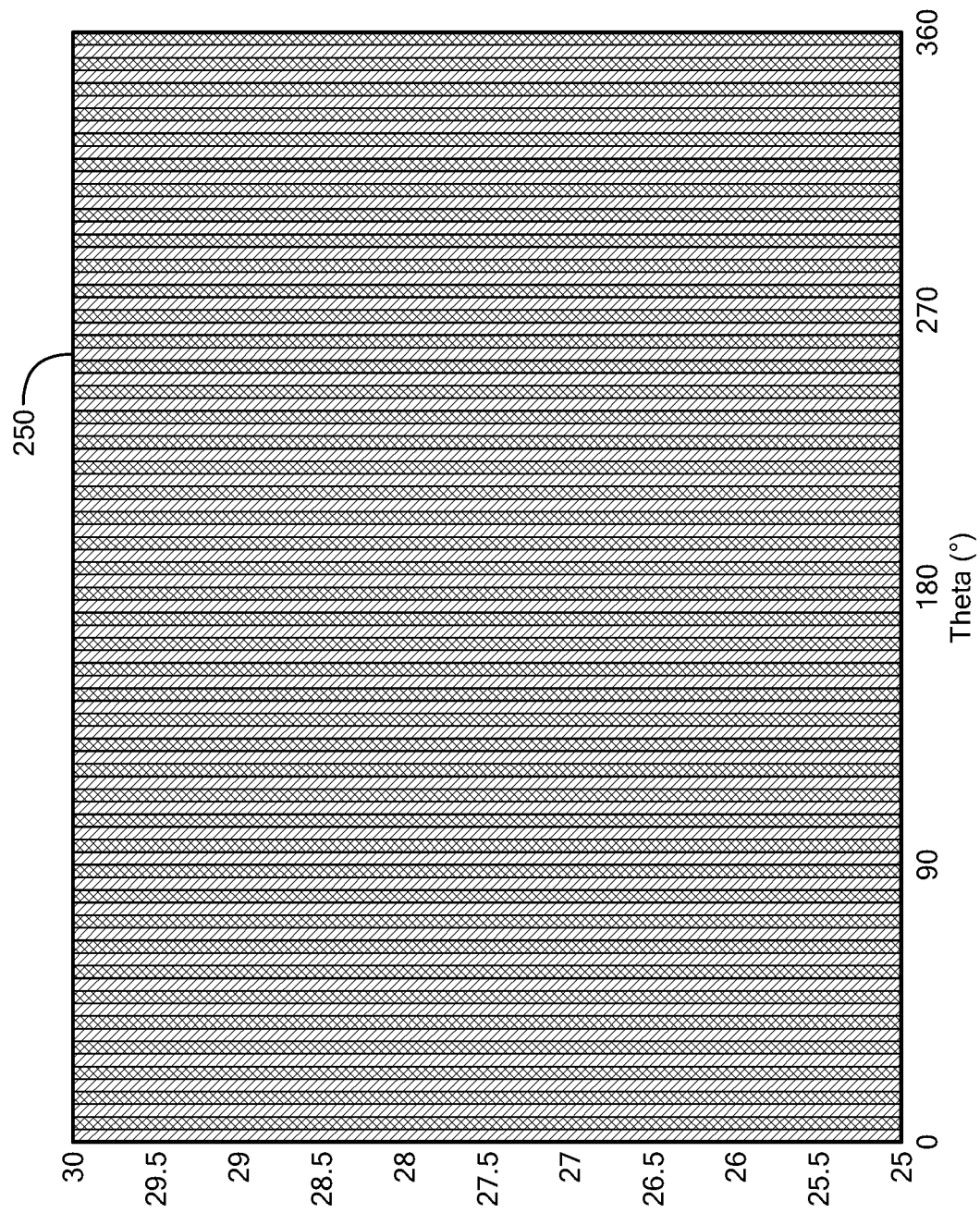
FIG. 2B is a graph of an example of a distribution of poles versus polar angle of the ring magnet of FIG. 2A.

Referring to FIGS. 2A and 2B, an example of the ring magnet 102 is a ring magnet 102'. The ring magnet 102' includes thirty-nine North-South pole pairs (e.g., North-South pole pair 202a, North-South pole pair 202b). Each North-South pole pair has a unique period length. That is, no two North-South pole pairs have the same period length. For example, the North-South pole pair 202b has a smaller period length than the North-South pole pair 202a. A graph 250 depicts a distribution of poles versus the polar angle of the ring magnet 102.

In other examples, the period length may increase linearly with absolute angle. In other examples, the period length may alternate in the upper and lower part of the target so that successive periods do not present large local gradients in period length. In further examples, the period length may be randomly distributed (with or without period length gradient capping). In still further examples, the period length may be distributed so that the smallest periods are placed at target phase requiring the highest resolution and the largest periods are placed where the lowest resolution is required.

Figure 3:
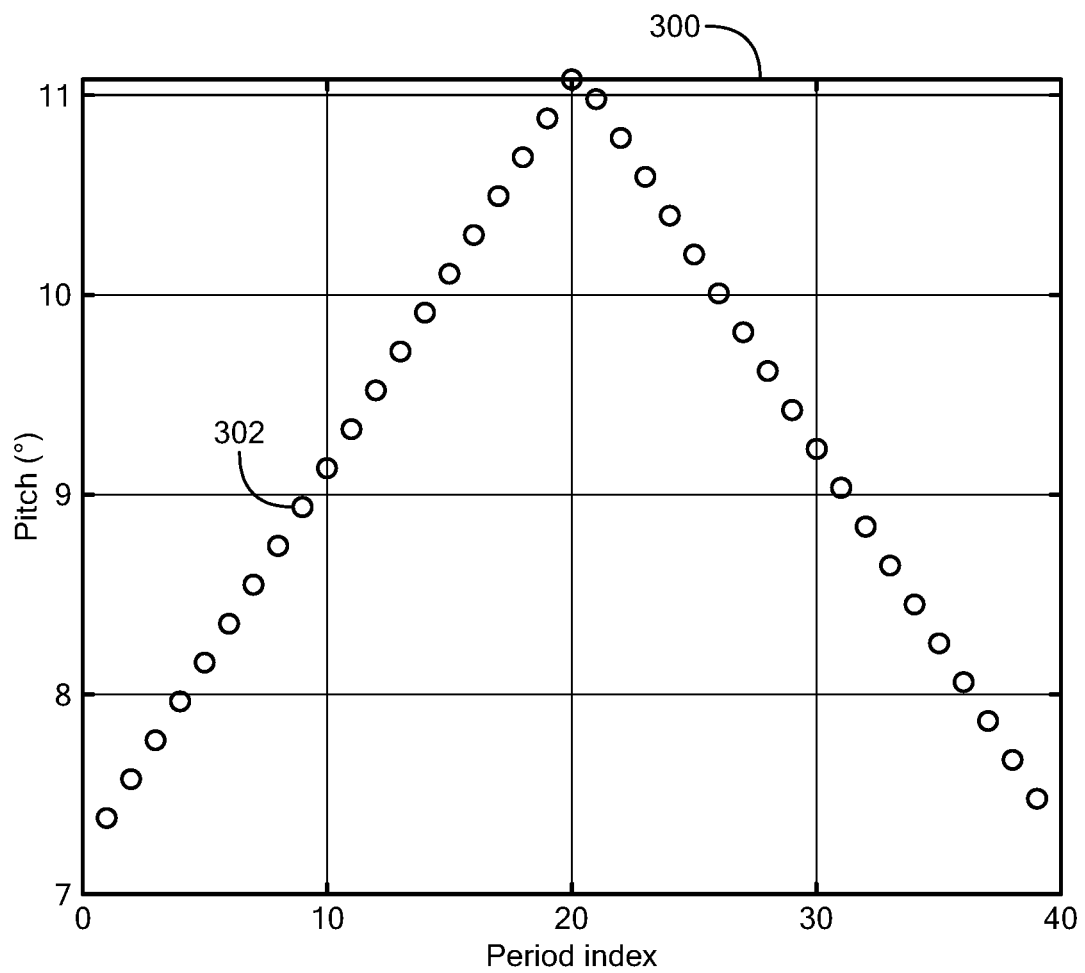
FIG. 3 is a graph of an example of pitch angle versus pitch index for the ring magnet of FIG. 2A.

Referring to FIG. 3, a graph 300 depicts a pitch (period length) versus pitch index of the ring magnet 102' (FIG. 2A). A pitch index corresponds to a unique North-South pole pair. Thus, each of the thirty-nine points in the graph 300 has unique period length. That is, no pitch index has the same pitch (period length). Thus, by knowing the pitch, the pitch index may be identified and therefore a location on the ring magnet (e.g., the ring magnet 102 (FIG. 1)) may be identified.

Figure 4:
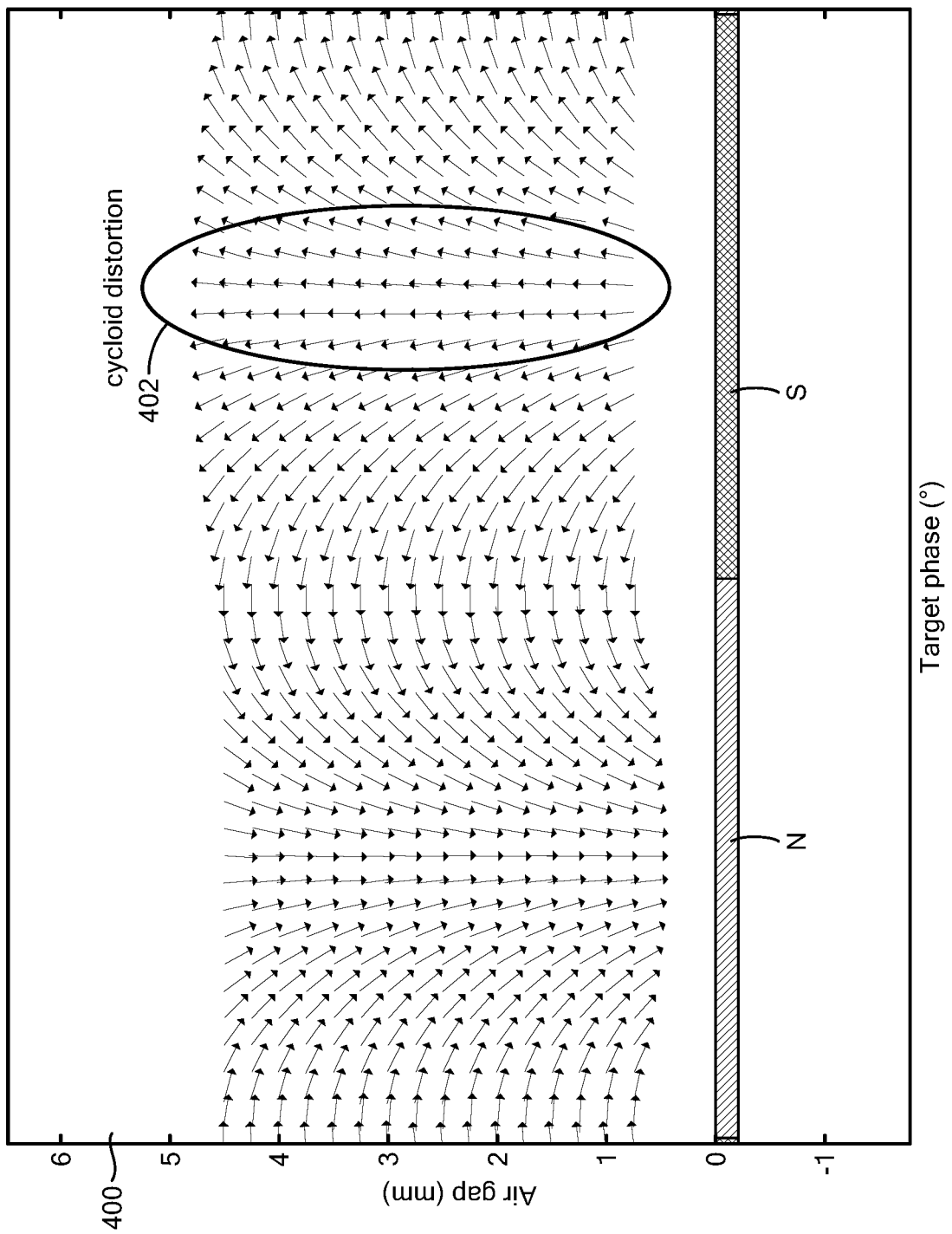
FIG. 4 is a graph of a magnetic-field map depicting an example of cycloid distortion.

Referring to FIGS. 4 and 5, a size of a ring magnet, the number of North-South pole pairs, and the period length of each North-South pole pairs may each be selected to avoid cycloid distortion and topological defects. For example, a graph 400 depicts cycloid distortion 402 and a graph 500 depicts topological defect 502, where an air gap in each graph is the distance of ring magnet (e.g., the ring magnet 102 (FIG. 1)) from a sensor (e.g., the off-axis sensor 106 (FIG. 1)).

In one example, a pitch distribution may be selected to control topological effects. For example, a pitch distribution may be selected by alternating in the upper and lower half of the ring magnet to provide lower topological defects. For example, in FIG. 3, the maximum pitch is in the center and then decreasing pitches are distributed alternatively left and right. In another example, the change in pitch length decreases from the maximum pitch at a constant rate.

A maximum pitch (PitchMax) is the largest pitch length in a ring magnet. A minimum pitch (PitchMin) is the smallest pitch in a ring magnet. A value corresponding to (PitchMax−PitchMin)/(PitchMax+PitchMin) may be selected to be less than 50%. Otherwise, strong cycloid distortions are created (e.g., 10° over the air gap (i.e., the gradient of the field angle versus the air gap)).

In one example, the average pitch (i.e., average pitch length) is selected so that half a period corresponds to a bridge spacing (e.g., distance between magnetic-field sensing element 802a and magnetic-field sensing element 804a) within +/−10%.

Figure 6A:
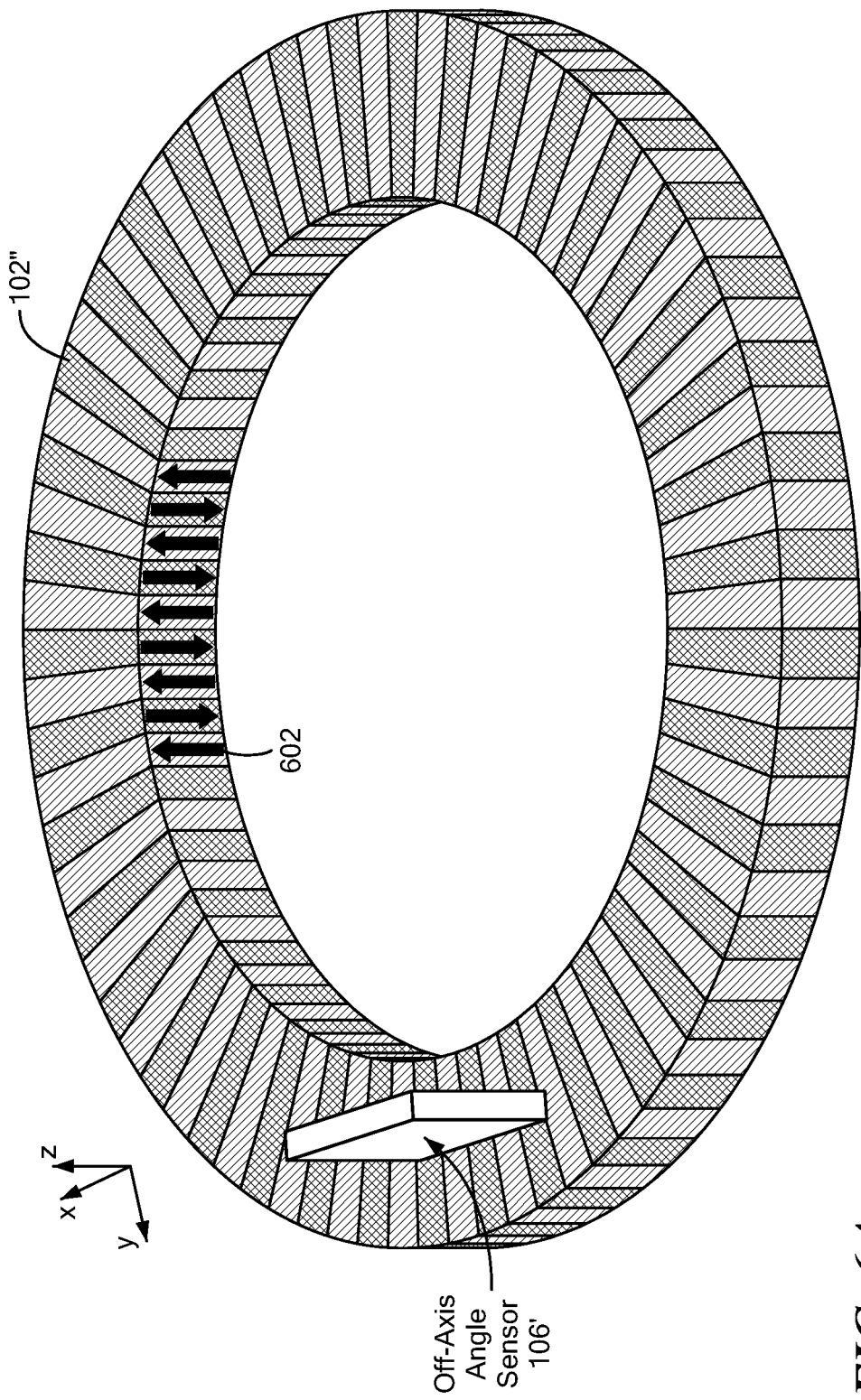
FIGS. 6A and 6B are examples of off-axis angle sensor placements with respect to a ring magnet where pole magnetizations are along an axis of rotation of the ring magnet.
Figure 6B:
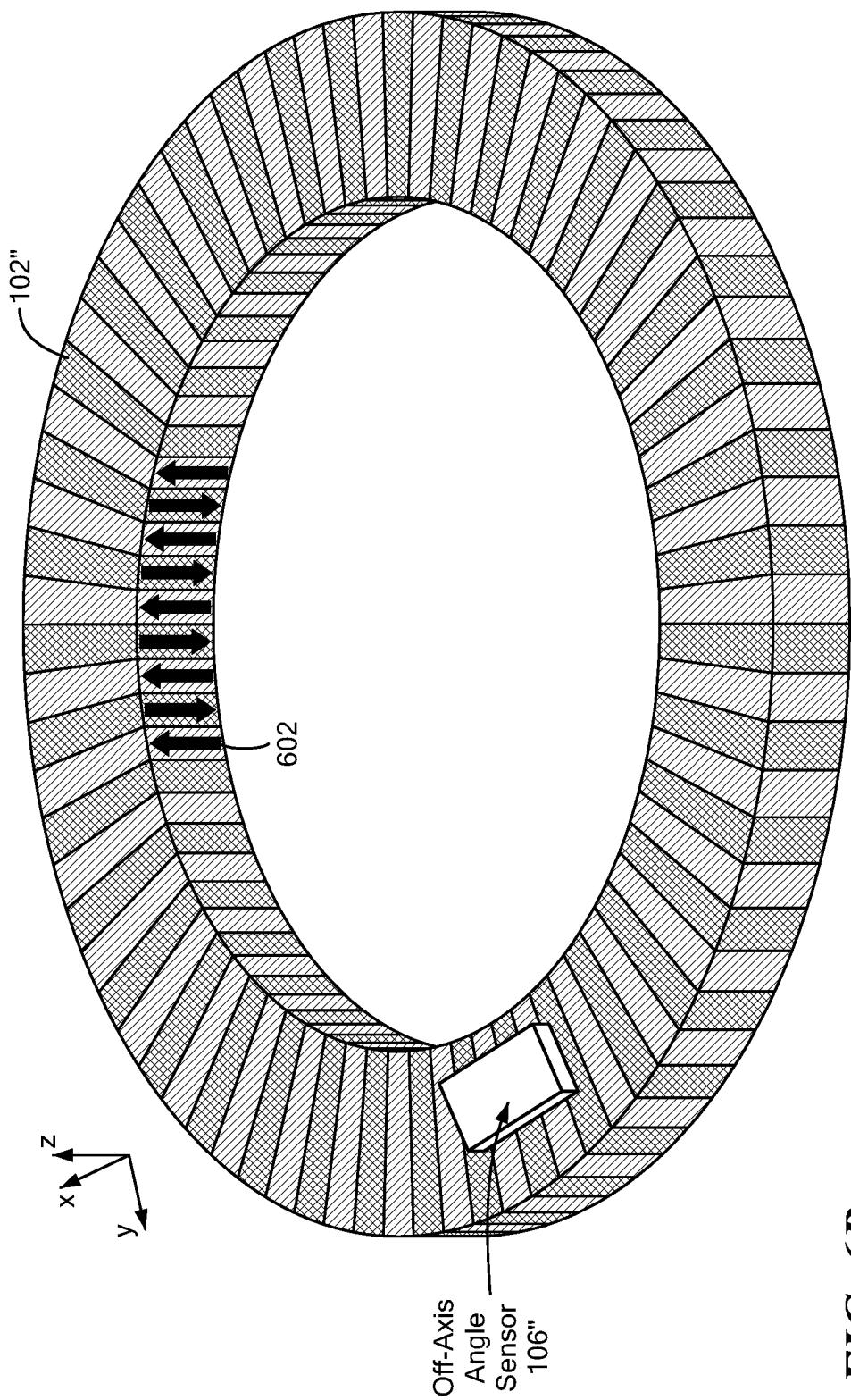

Referring to FIGS. 6A and 6B, an example of the ring magnet 102 is a ring magnet 102". Magnetization of North and South poles are along the z-axis of rotation of the ring magnet 102". For example, an arrow 602 shows a magnetization direction.

An example of the angle sensor 106 is the off-axis angle sensor 106'. In FIG. 6A, the off-axis angle sensor 106' is placed on top of the ring magnet 102". If the off-axis angle sensor 106' is parallel to the tangent plane to the target (i.e., the plane xz), then either vertical Hall plates or in-plane magnetoresistance elements may be used for the magnetic-field sensing elements (e.g., magnetic-field sensing elements 112 (FIG. 1)). In one particular example, tunneling magnetoresistance element (TMR) with vortex topology are used for the magnetic-field sensing elements (e.g., magnetic-field sensing elements 112 (FIG. 1)).

Another example of the angle sensor 106 is the off-axis angle sensor 106". In FIG. 6B, the off-axis angle sensor 106' is placed on top of the ring magnet 102". If the off-axis angle sensor 106" is placed in the plane parallel to the face of the target (i.e., plane xy), then a planar Hall plate and vertical Hall may be used to respectively sense the magnetic field in the x-direction (Hx) and the magnetic field in the z-direction (Hz). In another example, an in-plane magnetoresistance element and a perpendicular magnetic anisotropy (PMA) magnetoresistance element may be used respectively for the magnetic-field sensing elements (e.g., magnetic-field sensing elements 112 (FIG. 1)) to sense the magnetic field in the x-direction (Hx) and the magnetic field in the z-direction (Hz).

Figure 7A:
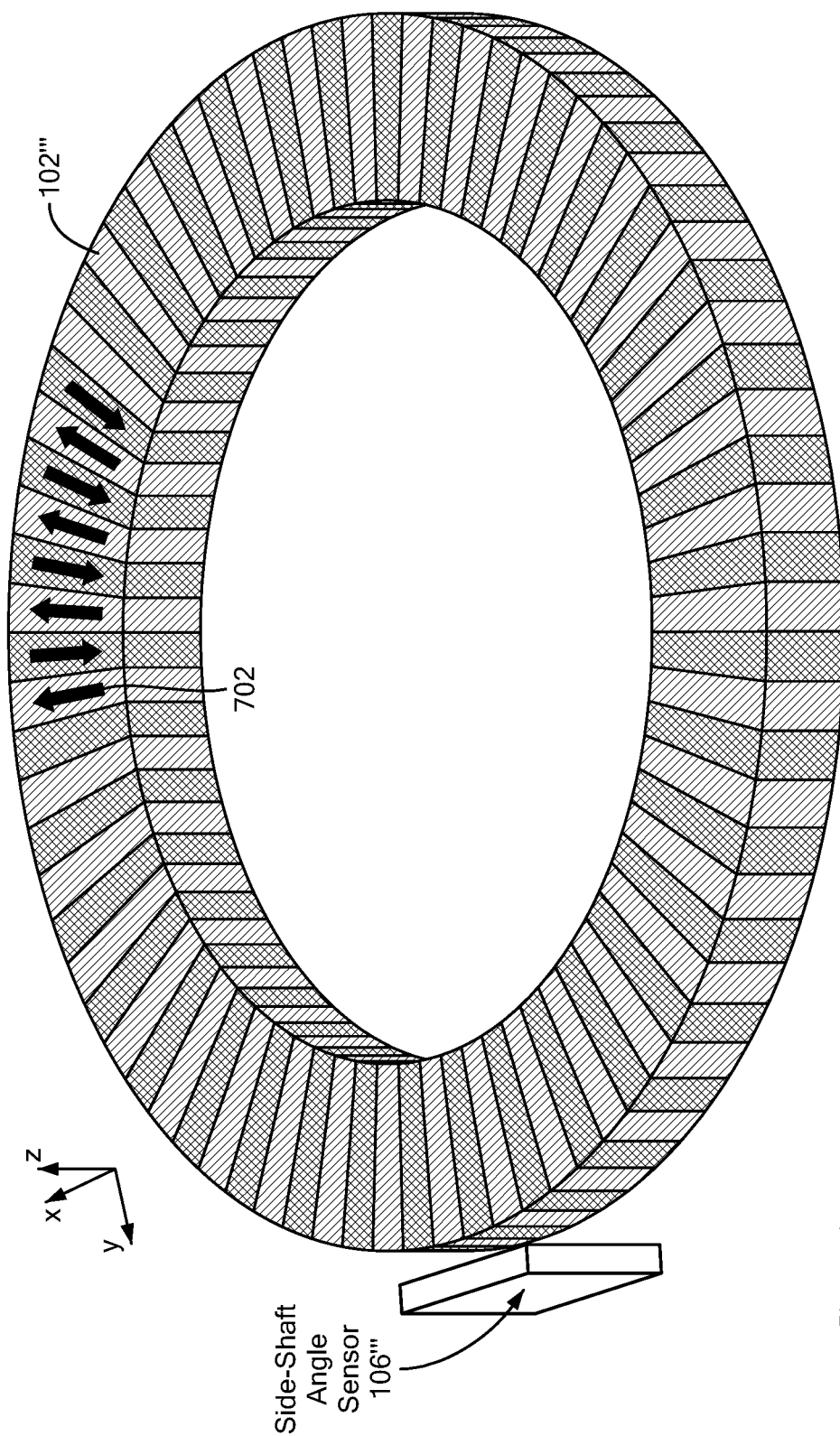
FIGS. 7A and 7B are examples of side-shaft angle sensor placements with respect to a ring magnet where pole magnetizations are radial.
Figure 7B:
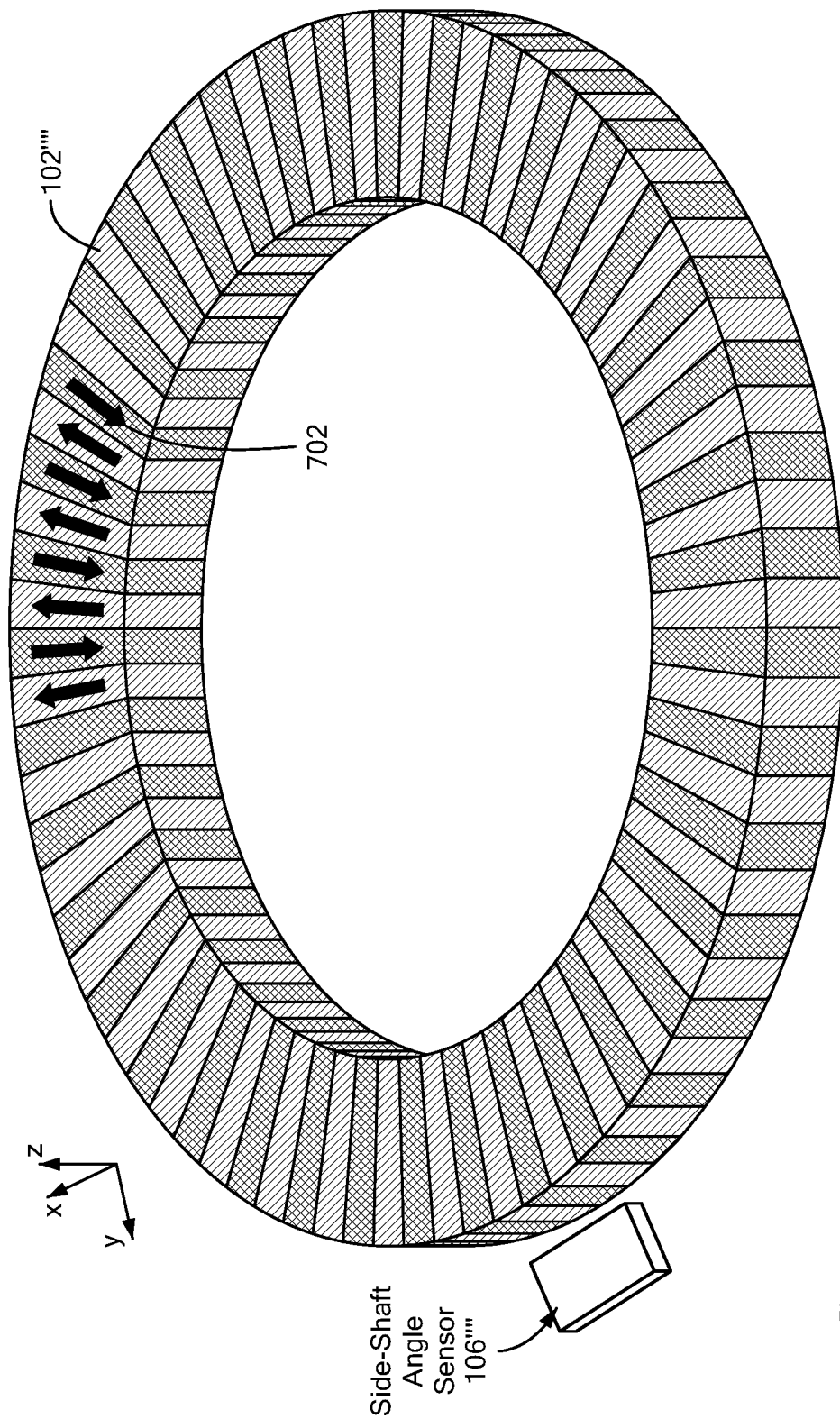

Referring to FIGS. 7A and 7B, an example of the ring magnet 102 is a ring magnet 102'''. Magnetization of North and South poles are radial. For example, an arrow 702 shows a magnetization direction.

An example of the angle sensor 106 is the side-shaft angle sensor 106'''. In FIG. 7A, the side-shaft angle sensor 106''' is placed beside the ring magnet 102'''. If the side-shaft angle sensor 106''' is parallel to the tangent plane to the ring magnet 102''' (i.e., plane xz), then a planar Hall plate and a vertical Hall plate may be used for the magnetic-field sensing elements (e.g., magnetic-field sensing elements 112 (FIG. 1)) to respectively sense the magnetic field in the x-direction (Hx) and the magnetic field in the y-direction (Hy). In another example, an in-plane magnetoresistance element and a PMA device may be used for the magnetic-field sensing elements (e.g., magnetic-field sensing elements 112 (FIG. 1)) to respectively sense the magnetic field in the x-direction (Hx) and the magnetic field in the y-direction (Hy).

An example of the sensor 106 is the side-shaft angle sensor 106''''. In FIG. 7B, the side-shaft angle sensor 106'''' is placed beside the ring magnet 102'''. If the sensor plane is in the plane parallel to the face of the ring magnet 102''' (i.e., plane xy), then either vertical Hall plates or in-plane magnetoresistance element may be used. In one particular example, tunneling magnetoresistance elements (TMR) are used for the magnetic-field sensing elements (e.g., magnetic-field sensing elements 112 (FIG. 1)).

Figure 8:
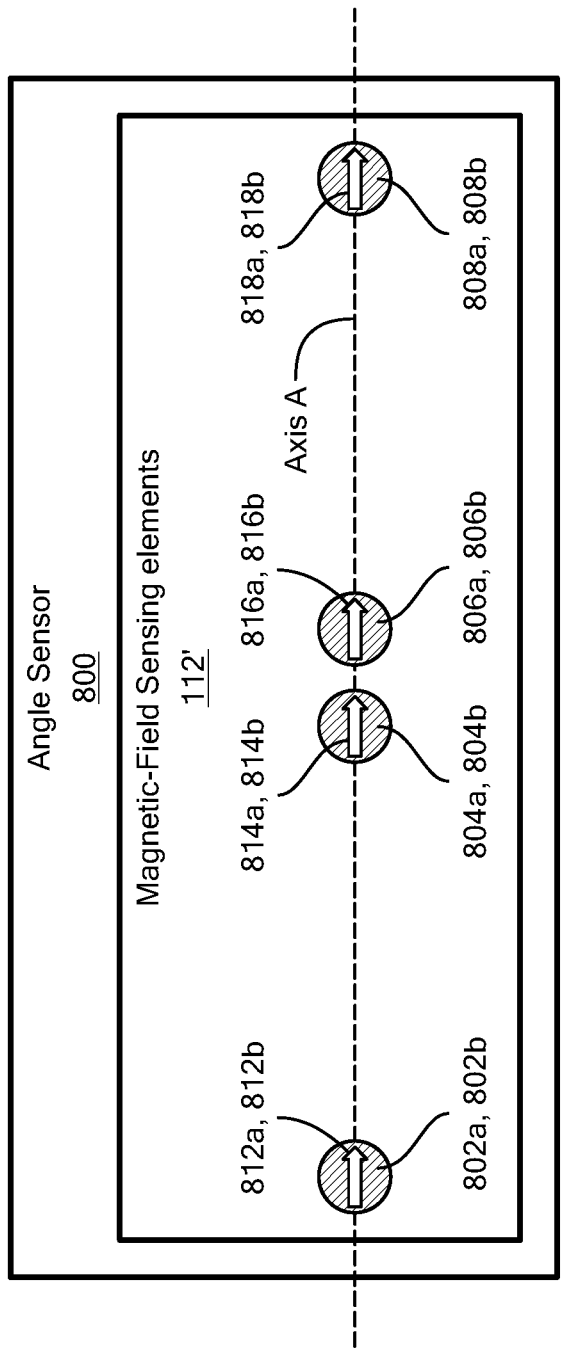
FIG. 8 is a diagram of an example of an angle sensor with four pairs of magnetic-field sensing elements.

Referring to FIG. 8, an example of the angle sensor 106 (FIG. 1) is an angle sensor 800. The angle sensor 800 includes a magnetic-field sensing elements 112', which is an example of the magnetic-field sensing elements 112 (FIG. 1). The magnetic-field sensing elements 112' include a first set of magnetic-field sensing elements 802a, 802b in a first location; a second pair of magnetic-field sensing elements 804a, 804b in a second location; a third pair of magnetic-field sensing elements 806a, 806b in a third location; and a fourth pair of magnetic-field sensing elements 808a, 808b located in a fourth location. The first, second, third and fourth pairs of magnetic-field sensing elements 802a, 802b, 804a, 804b, 806a, 806b, 808a, 808b are placed on an axis A.

The magnetic-field sensing element 802a has a reference direction 812a and magnetic-field sensing element 802b has a reference direction 812b. The magnetic-field sensing element 804a has a reference direction 814a and the magnetic-field sensing element 804b has a reference direction 814b. The magnetic-field sensing element 806a has a reference direction 816a and magnetic-field sensing element 806b has a reference direction 816b. The magnetic-field sensing element 808a has a reference direction 818a and the magnetic-field sensing element 808b has a reference direction 818b.

The reference directions 812a, 812b, 814a, 814b, 816a, 816b, 818a, 818b are the same and zero degrees with respect to the axis A. The reference direction is the direction that the magnetic-field sensing element is the most sensitive to changes in a magnetic field.

Referring to FIGS. 9A and 9B, a left bridge 902 (e.g., a differential bridge) is formed by having the magnetic-field sensing elements 802a, 804a on one leg of the left bridge and the magnetic-field sensing elements 802b, 804b on the other leg of the left bridge. A right bridge 904 (e.g., a differential bridge) is formed by having the magnetic-field sensing elements 806a, 808a on one leg of the right bridge and the magnetic-field sensing elements 806b, 808b on the other leg of the right bridge.

In one example, the bridges 902, 904 are gradiometers that reject a stray magnetic field along the reference axis (axis A). In this example, the magnetic field sensing elements 812a, 812b, 814a, 814b, 816a, 816b, 818a, 818b may be a TMR (e.g., a vortex TMR or a PMA TMR).

In other examples, where a stray magnetic field is not significant, then the magnetic field sensing elements 812a, 812b, 814a, 814b, 816a, 816b, 818a, 818b may be any GMR/TMR implemented without PMA or vortex topology.

Figure 10A:
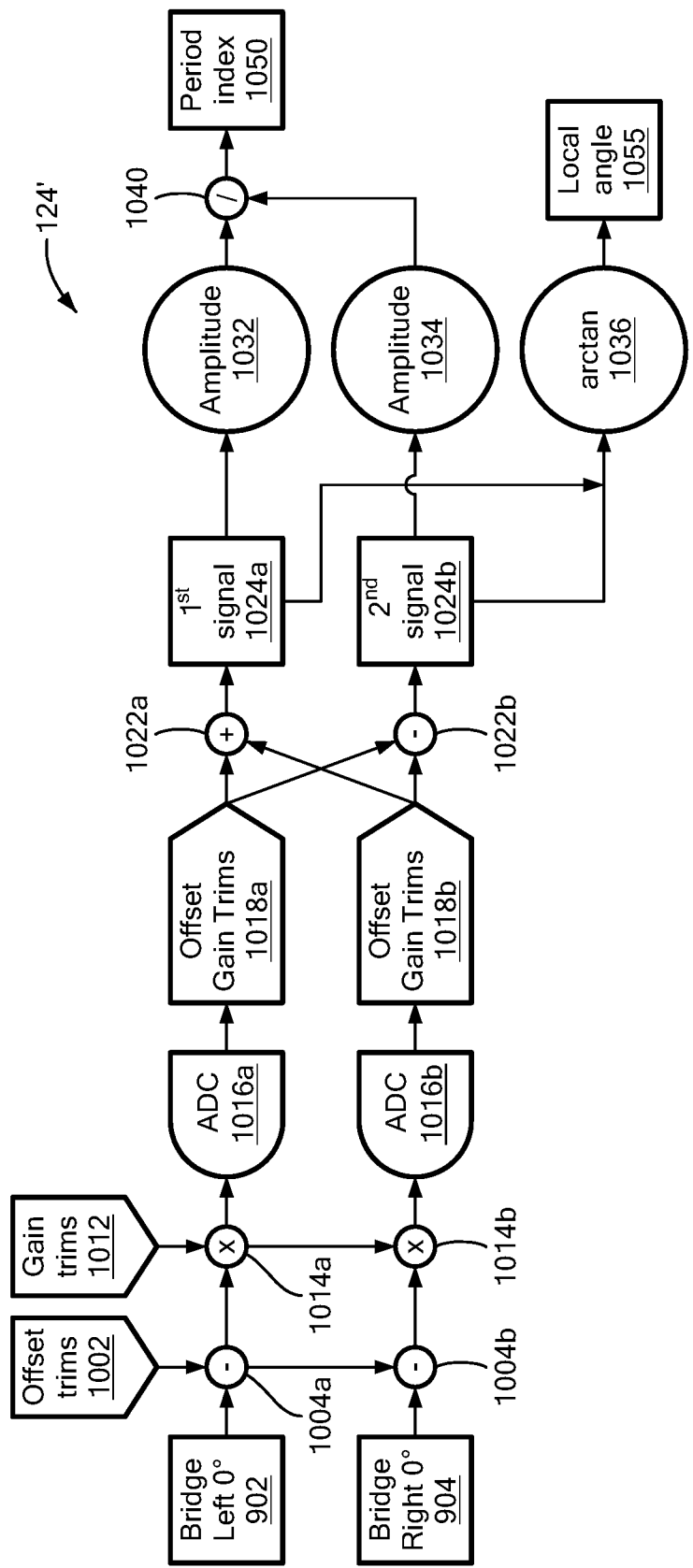
FIGS. 10A and 10B are a block diagram of an example of processing circuitry.
Figure 10B:
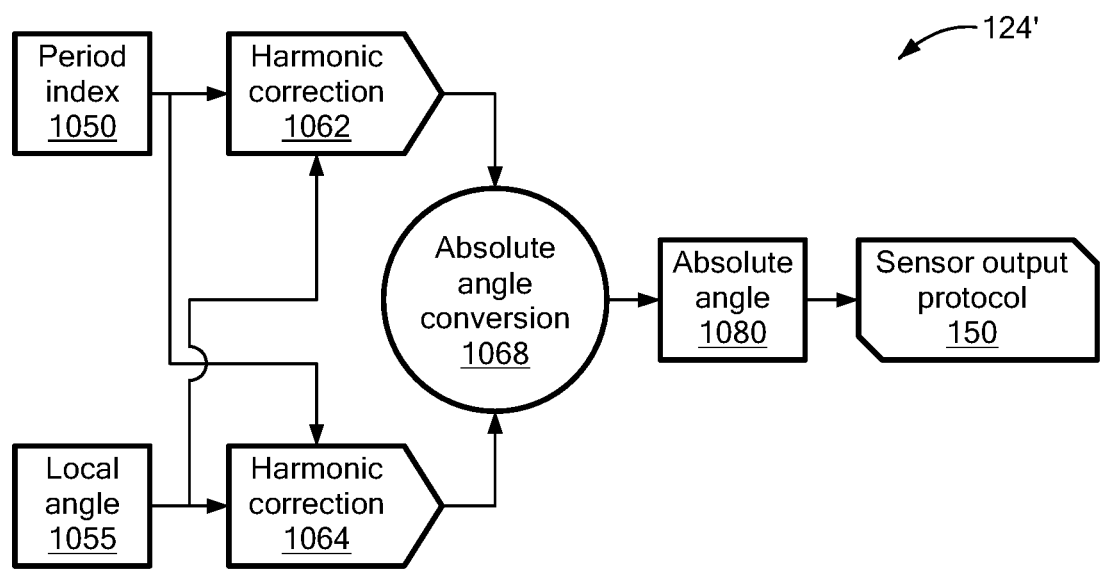

Referring to FIGS. 10A and 10B, an example of the processing circuitry 124 (FIG. 1) is processing circuitry 124'. The output of the bridge 902 is received by a subtractor 1004a where the output of the bridge 902 is reduced by offset trims 1002. An output of the subtractor 1004a is received by multiplicator 1014a and multiplied by gain trims 1012. An output of the multiplicator 1014a is converted to a digital signal by an analog-to-digital converter (ADC) 1016a to produce an offset gains trims digital signal 1018a.

The output of the bridge 904 is received by a subtractor 1004b where the output of the bridge 904 is reduced by the offset trims 1002. An output of the subtractor 1004b is received by multiplicator 1014b and multiplied by the gain trims 1012. An output of the multiplicator 1014b is converted to a digital signal by an analog-to-digital converter (ADC) 1016b to produce an offset gains trims digital signal 1018b.

The offset gain trims digital signal 1018a is added to the offset gain trims digital signal 1018b by the adder 1022a to form a first signal 1024a. The offset gain trims digital signal 1018b is subtracted from the offset gain trims digital signal 1018a by the subtractor 1022b to form a second signal 1024a.

An amplitude circuit 1032 outputs amplitudes of the first signal 1024a to a divider 1040 and an amplitude circuit 1034 outputs amplitudes of the second signal 1024b to the divider 1040. The divider 1040 divides the amplitudes from the first signal 1024a by the amplitudes of the second signal 1024b to form a period index 1050. In other examples, the divider 1040 may be replaced by a subtractor.

An arctangent circuit 1036 divides the second signal 1024a from the first signal 1024a and performs an arctangent function to determine a local angle signal 1055. The local angle is defined to be the angle within the North-South pole period corresponding to the period index. In one example, the local angle θ is:

$$\theta = \arctan\left(\frac{L-R}{L+R} \times \frac{\text{Amplitude}(L+R)}{\text{Amplitude}(L-R)}\right),$$

where L is the output of the left bridge 904, and R is the output of the right bridge 902.

The period index 1050 is corrected by the harmonic correction circuit 1062 based on the local angle 1055 and the local angle 1055 is corrected by the harmonic correction circuit 1064 based on the period index 1050. The absolute angle conversion circuit 1068 receives the harmonic corrected signals from the harmonic correction circuits 1062, 1064 to form an absolute angle 1080 which is converted to a sensor output protocol signal 150. In one example, the absolute angle conversion circuit 1068 includes a register (not shown) that stores a position of each North-South pole pair and their length represented by the terms PolePos and PolLength, respectively, which are vectors. A term Period-Index corresponds to the period index 1050. The output of the absolute angle conversion circuit 1068 is:

output=PolPos[PeriodIndex]+LocalAnge*PoleLength [PeriodIndex]/360.

Figure 11:
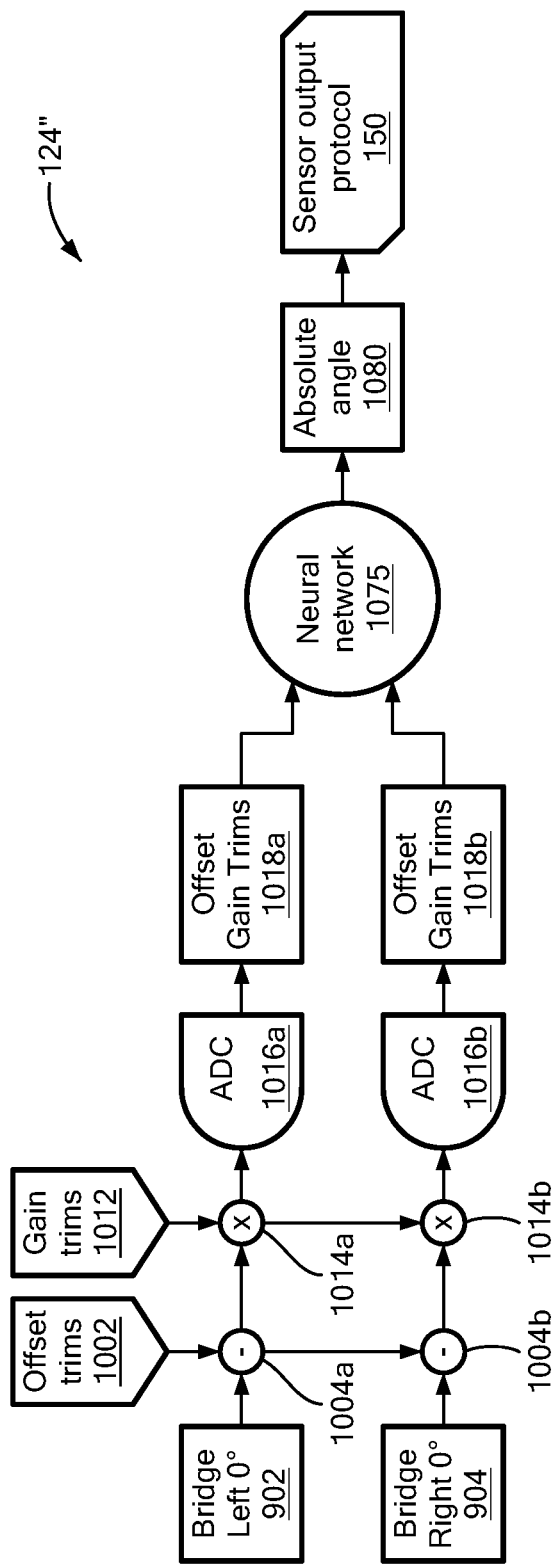
FIG. 11 is a block diagram of another example of the processing circuitry.

Referring to FIG. 11, another example of the processing circuitry 124 (FIG. 1) is the processing circuitry 124". The processing circuitry 124" is the same as the processing circuitry 124' except the adder 1022a; the subtractor 1022b; the amplitude circuits 1032, 1034; the divider 1040; the arctangent circuit 1036, the harmonic correction circuits 1062, 1064 and the absolute angle conversion circuit 1068 are replaced by a neural network circuit 1075.

In one example, the neural network circuit 1075 is a network of elementary units. Each unit determines a linear combination of all its inputs and a bias term, and then processes the result through an activation function that is a nonlinear function (except on the output units where it may be linear). The units are organized in layers and each layer takes as inputs the outputs of the previous layers. The first layer takes as an input an input layer, which includes parameters fed to the neural network circuit 1075. The number of units in each layer may be different. In one example, the neural network circuit 1075 is a multilayer perceptron (MLP).

Figure 12:
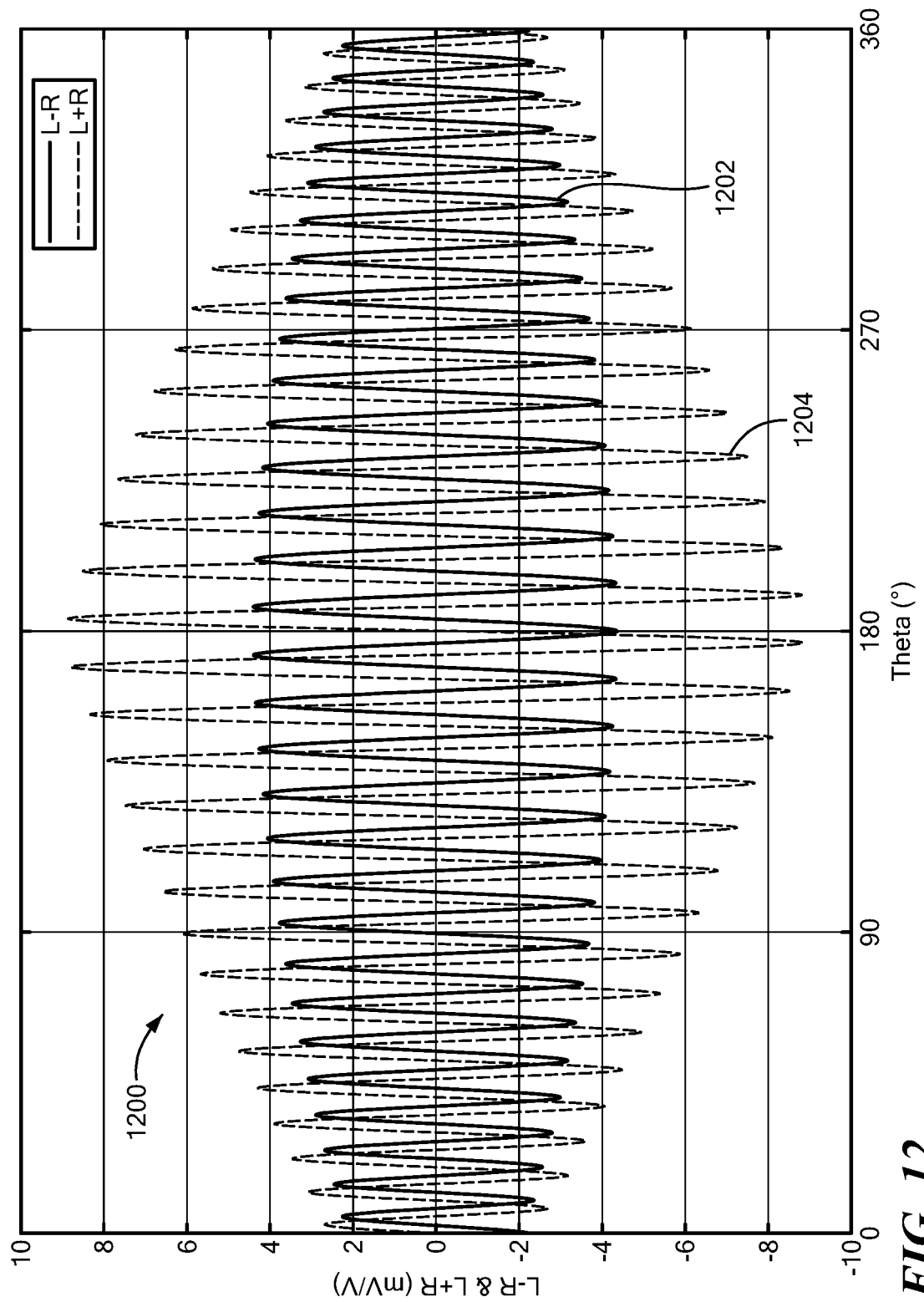
FIG. 12 is a graph of an example of a first signal resulting from adding output signals from the left and right bridges of FIGS. 9A and 9B and an example of a second signal resulting from subtracting the output of the right bridge from the left bridge of FIGS. 9A and 9B.

Referring to FIG. 12, a graph 1200 includes a plot 1202, which is the second signal 1024b (FIG. 10A) or the difference of an output from the offset gain trims 1018a (FIG. 10A) less an output signal from the output gain trims 1018b (FIG. 10A). The graph 1200 also includes a plot 1204, which is the first signal 1024a (FIG. 10A) or the summation of the output from the offset gain trims 1018a (FIG. 10A) and the output signal from the offset gain trims 1018b (FIG. 10A).

Figure 13:
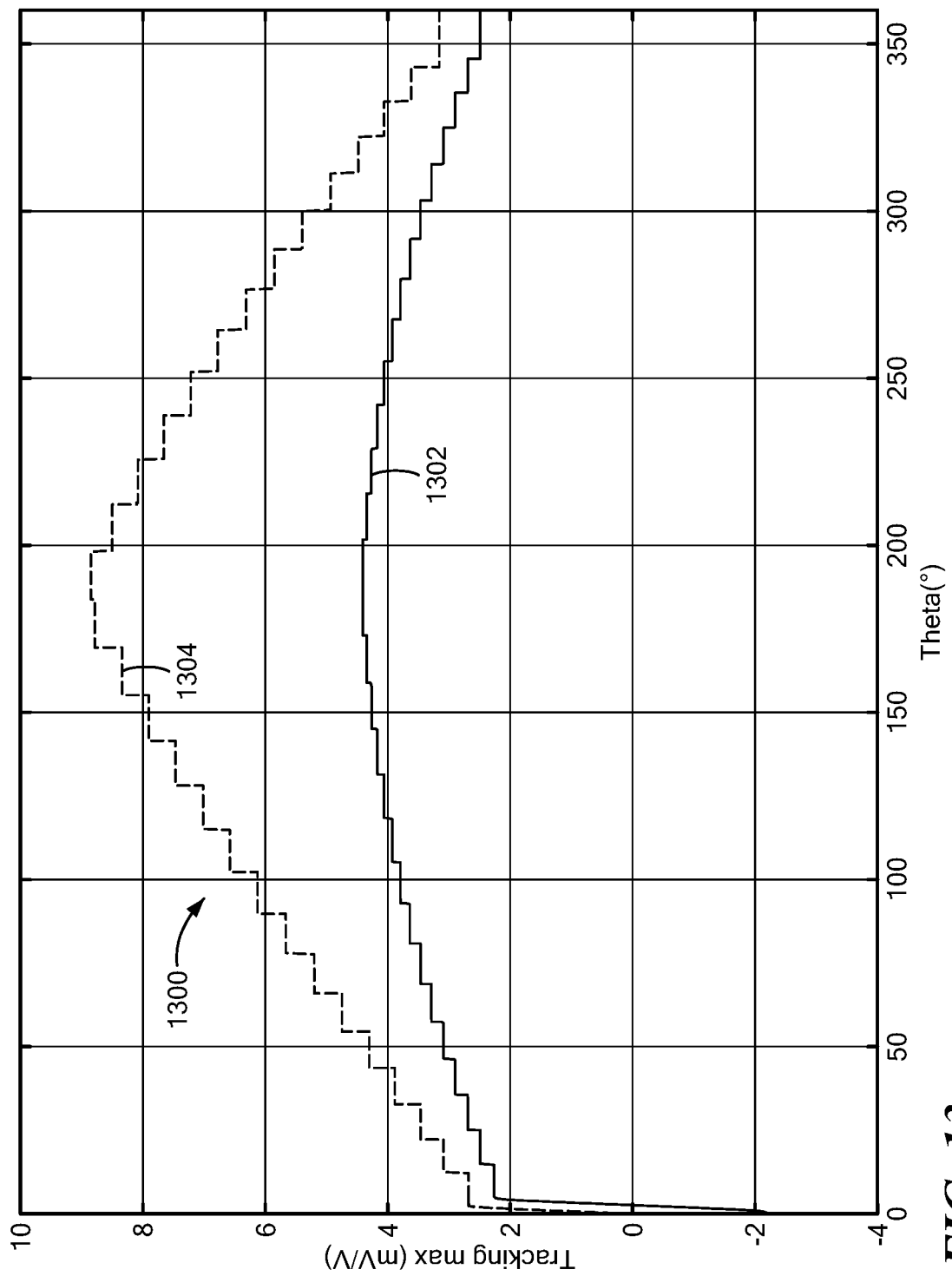
FIG. 13 is a graph representing amplitudes of the first signal of FIG. 12 and representing amplitudes of the second signal of FIG. 12.

Referring to FIG. 13, a graph 1300 includes a plot 1302, which includes amplitudes of the plot 1202 (FIG. 12). The graph 1300 also includes a plot 1304, which includes amplitudes of the plot 1204.

Figure 14:
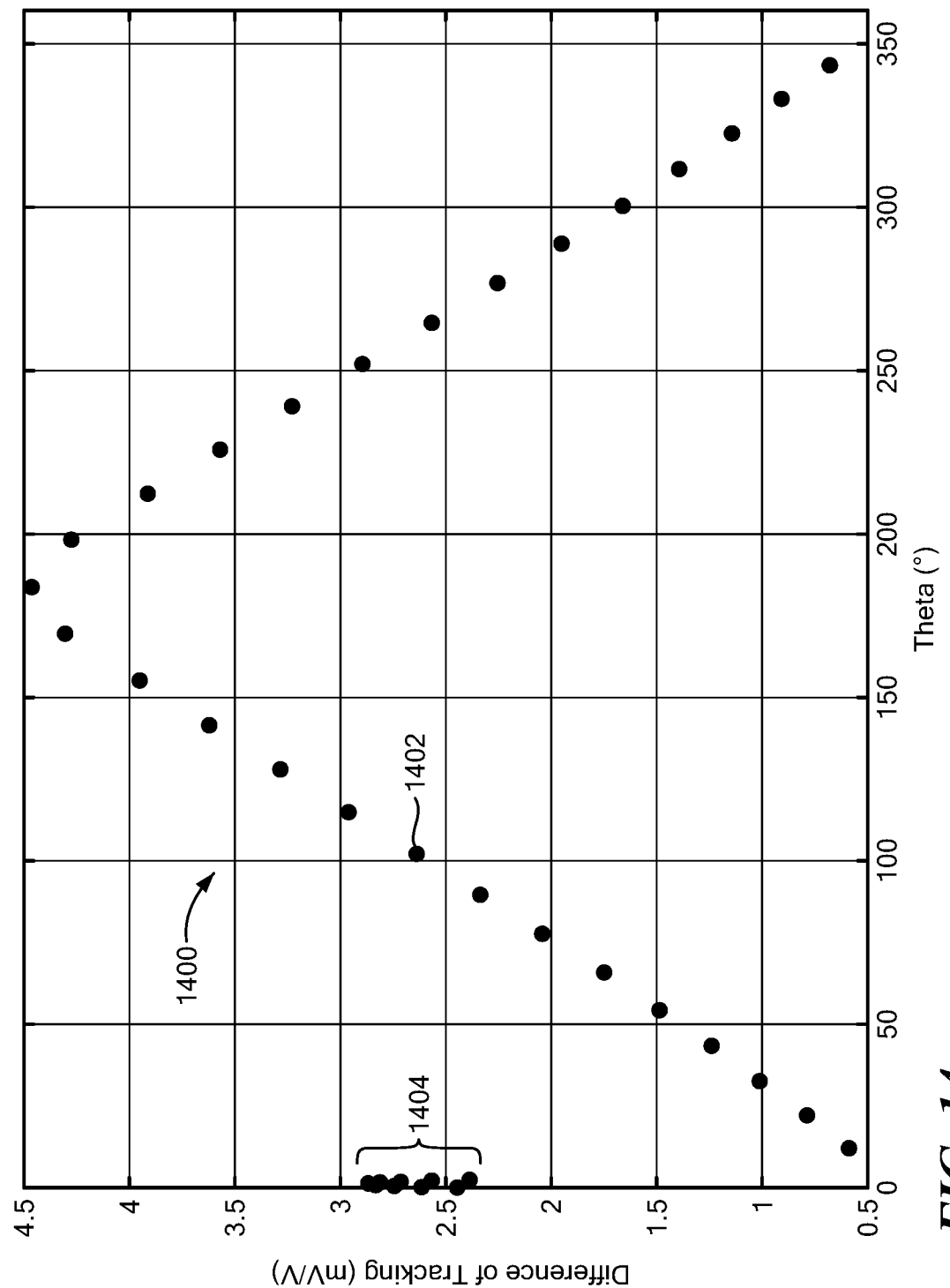
FIG. 14 is a graph of representing the difference of the third and fourth signals of FIG. 13.

Referring to FIG. 14, a graph 1400 includes a set of points (e.g., a point 1402), which is the difference of amplitudes between the plot 1304 (FIG. 13) and the plot 1302 (FIG. 13). A set of points 1404 to the left of the graph 1402 are not used since these points represent a beginning of the first period when tracking has not yet been initialized. Therefore, not using the set of points 1404, the remaining points are similar to the points in the graph 300 (FIG. 3). Thus, using the outputs of the right and left bridges 902, 904, the points in FIG. 14 may be used to identify the North-South pole pair on the ring magnet. In other examples, the graph 1400 may be replaced with a graph that takes the ratios of the amplitudes of the plots 1302, 1304 (FIG. 13).

Figure 15:
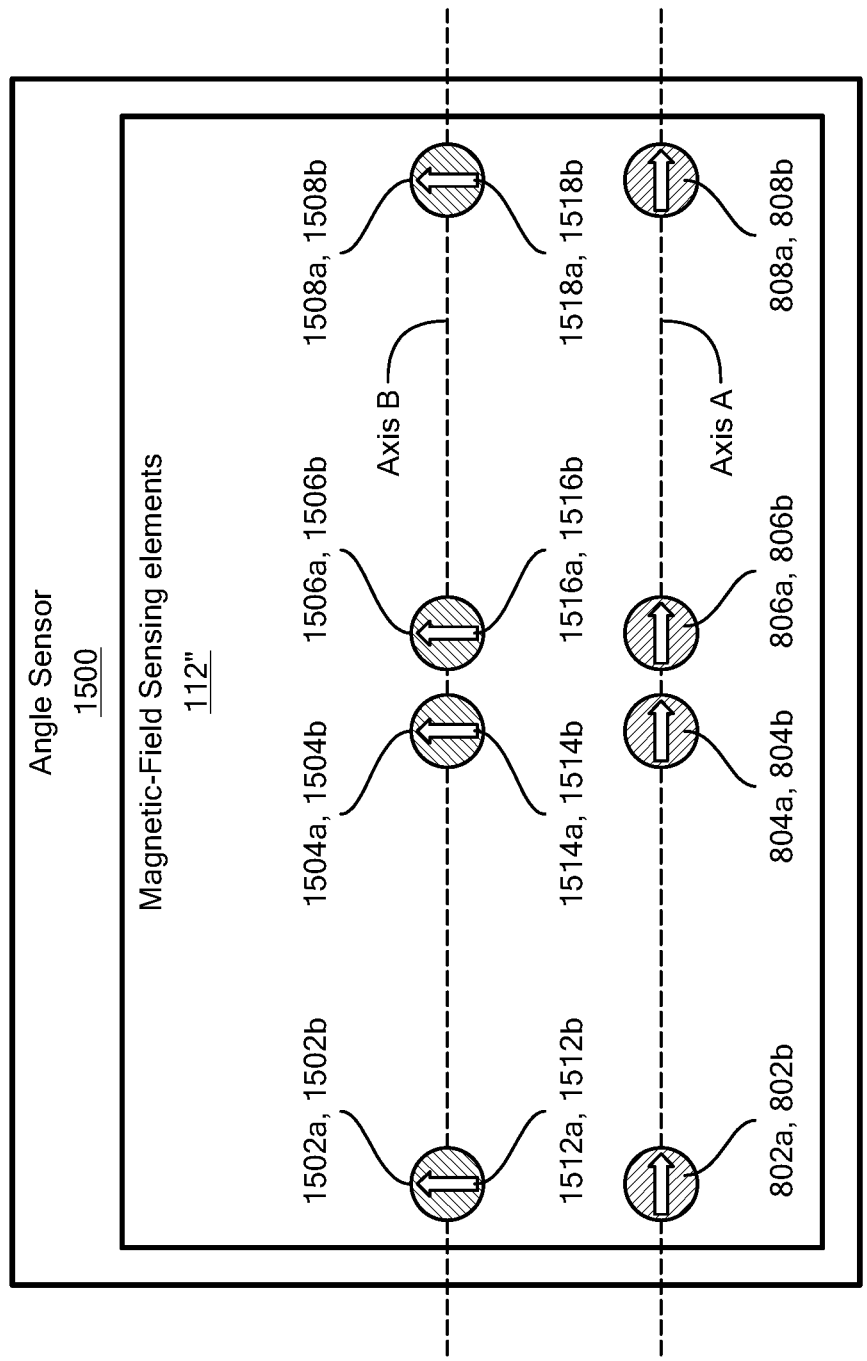
FIG. 15 is a diagram of another example of an angle sensor with four additional pairs of magnetic sensing elements from the off-axis sensor in FIG. 8.

Referring to FIG. 15, an example of the angle sensor 102 (FIG. 1) is an angle sensor 1500. The angle sensor 1500 includes a magnetic-field sensing elements 112". The magnetic-field sensing elements 112" is the same as magnetic-field sensing elements 112' except the magnetic-field sensing elements 112" includes additional magnetic-field sensing elements. In particular, the magnetic-field sensing elements 112" further includes include a fifth pair of magnetic-field sensing elements 1502a, 1502b in a fifth location; a sixth pair of magnetic-field sensing elements 1504a, 1504b in a sixth location; a seventh pair of magnetic-field sensing elements 1506a, 1506b in a seventh location; and an eighth pair of magnetic-field sensing elements 1508a, 1508b located in an eighth location. The fifth, sixth, seventh and eighth pairs of magnetic-field sensing elements 1502a, 1502b, 1504a, 1504b, 1506a, 1506b, 1508a, 1508b are placed on an axis B parallel to the axis A.

The magnetic-field sensing element 1502a has a reference direction 1512a and magnetic-field sensing element 1502b has a reference direction 1512b. The magnetic-field sensing element 1504a has a reference direction 1514a and the magnetic-field sensing element 1504b has a reference direction 1514b. The magnetic-field sensing element 1506a has a reference direction 1516a and magnetic-field sensing element 1506b has a reference direction 1516b. The magnetic-field sensing element 1508a has a reference direction 1518a and the magnetic-field sensing element 1508b has a reference direction 1518b. The reference directions 1512a, 1512b, 1514a, 1514b, 1516a, 1516b, 1518a, 1518b are the same and orthogonal to the axis A and to the axis B.

Referring to FIGS. 16A and 16B, with the additional magnetic-field sensing elements 1512a, 1512b, 1514a, 1514b, 1516a, 1516b, 1518a, 1518b, additional bridges are formed. For example, a left bridge 1602 (e.g., a differential bridge) is formed by having the magnetic-field sensing elements 1502a, 1504a on one leg of the left bridge 1602 and the magnetic-field sensing elements 1502b, 1504b on the other leg of the left bridge 1602. A right bridge 1604 (e.g., a differential bridge) is formed by having the magnetic-field sensing elements 1506a, 1508a on one leg of the right bridge 1604 and the magnetic-field sensing elements 1506b, 1508b on the other leg of the right bridge 1604.

In one example, the bridges 1602, 1604 are gradiometers that reject a stray magnetic field along the reference direction. In this example, the magnetic field sensing elements 1502a-1502d may be a TMR (e.g., a vortex TMR or a PMA TMR).

In other examples, where a stray magnetic field is not significant, then the magnetic field sensing elements 1502a-1502d may be any GMR/TMR implemented without PMA or vortex topology.

Figure 17A:
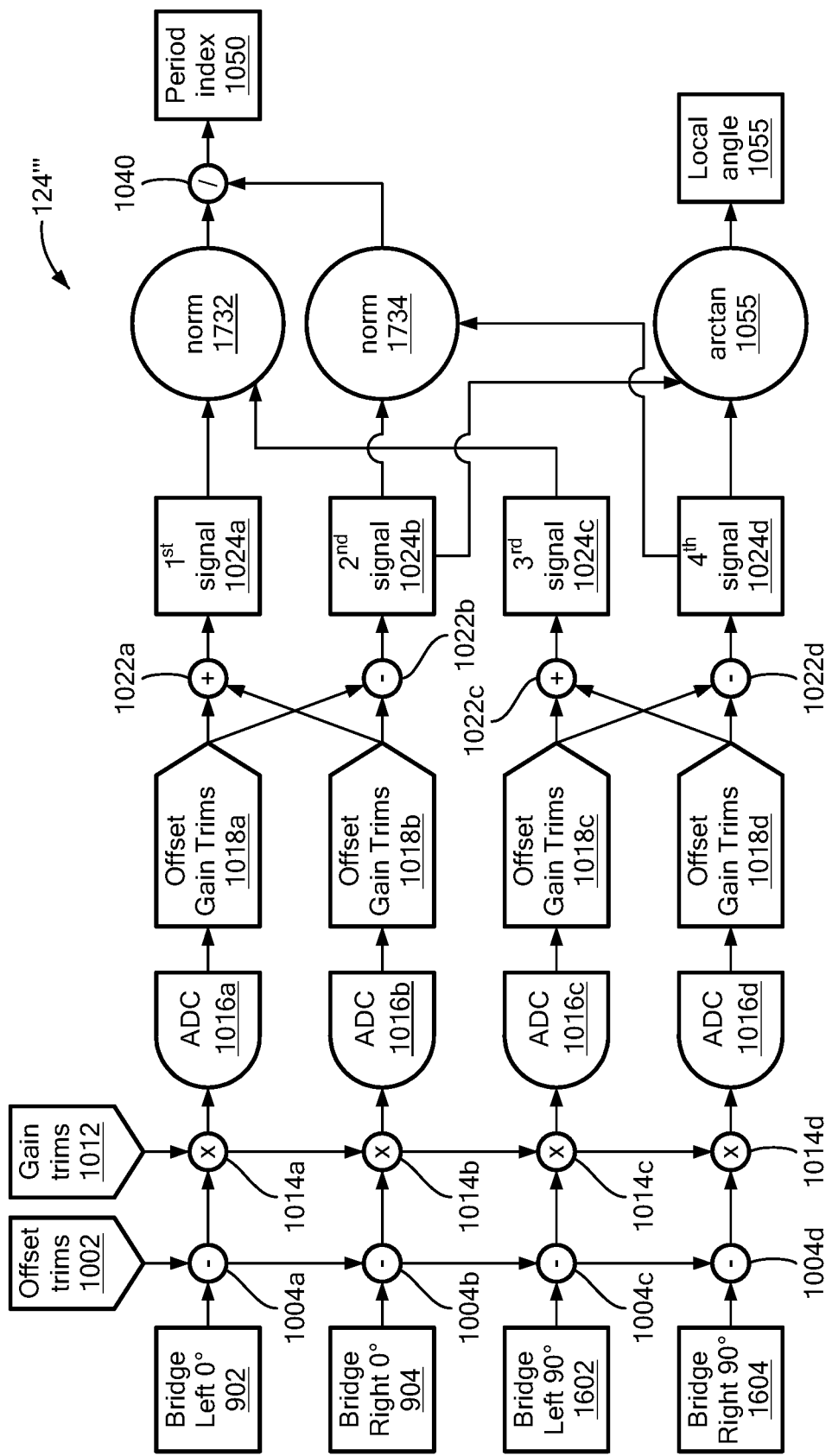
FIGS. 17A and 17B are a block diagram of a further example of the processing circuitry.
Figure 17B:
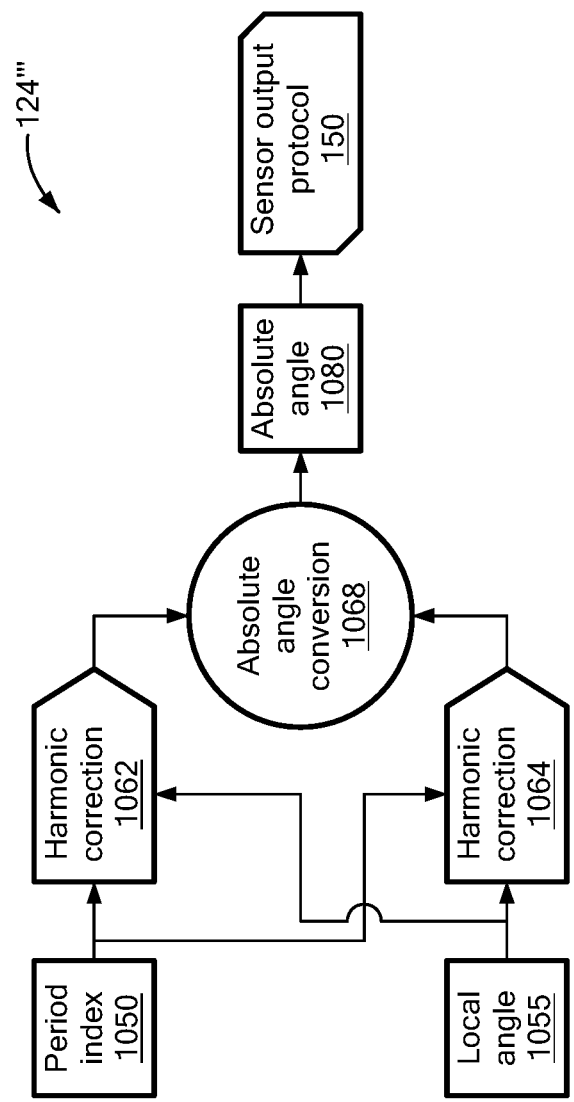

Referring to FIGS. 17A and 17B, another example of the processing circuitry 124 is processing circuitry 124'''. Processing circuitry 124''' is the same as processing circuitry 124' except the processing circuitry 124''' includes, for example, additional components such as a subtractor 1004c, a subtractor 1004d, a multiplicator 1014c, a multiplicator 1014d, an ADC 1016c, an ADC 1016d, an adder 1022c, and an adder 1022d to process outputs of the bridges 1602, 1604.

The output of the bridge 1602 is received by the subtractor 1004c where the output of the bridge 1602 is reduced by the offset trims 1002. An output of the subtractor 1004c is received by the multiplicator 1014c and multiplied by gain trims 1012. An output of the multiplicator 1014c is converted to a digital signal by the ADC 1016c to produce an offset gains trims digital signal 1018c.

The output of the bridge 1604 is received by the subtractor 1004d where the output of the bridge 1604 is reduced by the offset trims 1002. An output of the subtractor 1004d is received by multiplicator 1014d and multiplied by the gain trims 1012. An output of the multiplicator 1014d is converted to a digital signal by the ADC 1016d to produce an offset gains trims digital signal 1018d.

The offset gain trims digital signal 1018c is added to the offset gain trims digital signal 1018d by the adder 1022c to form a third signal 1024c. The offset gain trims digital signal 1018d is subtracted from the offset gain trims digital signal 1018c by the subtractor 1022d to form a fourth signal 1024d.

A normalization circuit 1732 normalizes the first signal 1024a and the third signal 1024c to produce an output signal that squares each signal 1024a, 1024c, determines a sum of the two square terms and determines the absolute value of the square root of the sum.

A normalization circuit 1734 normalizes the second signal 1024b and the fourth signal 1024d to produce an output signal that squares each signal 1024b, 1024d, determines the sum of the two square terms and determines an absolute value of the square root of the sum.

The divider 1040 divides the output of the normalization circuit 1732 by the output of the normalization circuit 1734 to produce the period index 1050.

In some examples, the first signal 1024a is equal to the sum of the output of the left bridge 902 and the right bridge 904 times an ellipticity correction error $E_{CF}$. The second signal 1024b is the difference of the outputs of the left and right bridges 902, 904 times $E_{CF}$. In one example, the ellipticity correction error ECF is added by the offset gain trims 1018a, 1018b.

Figure 18:
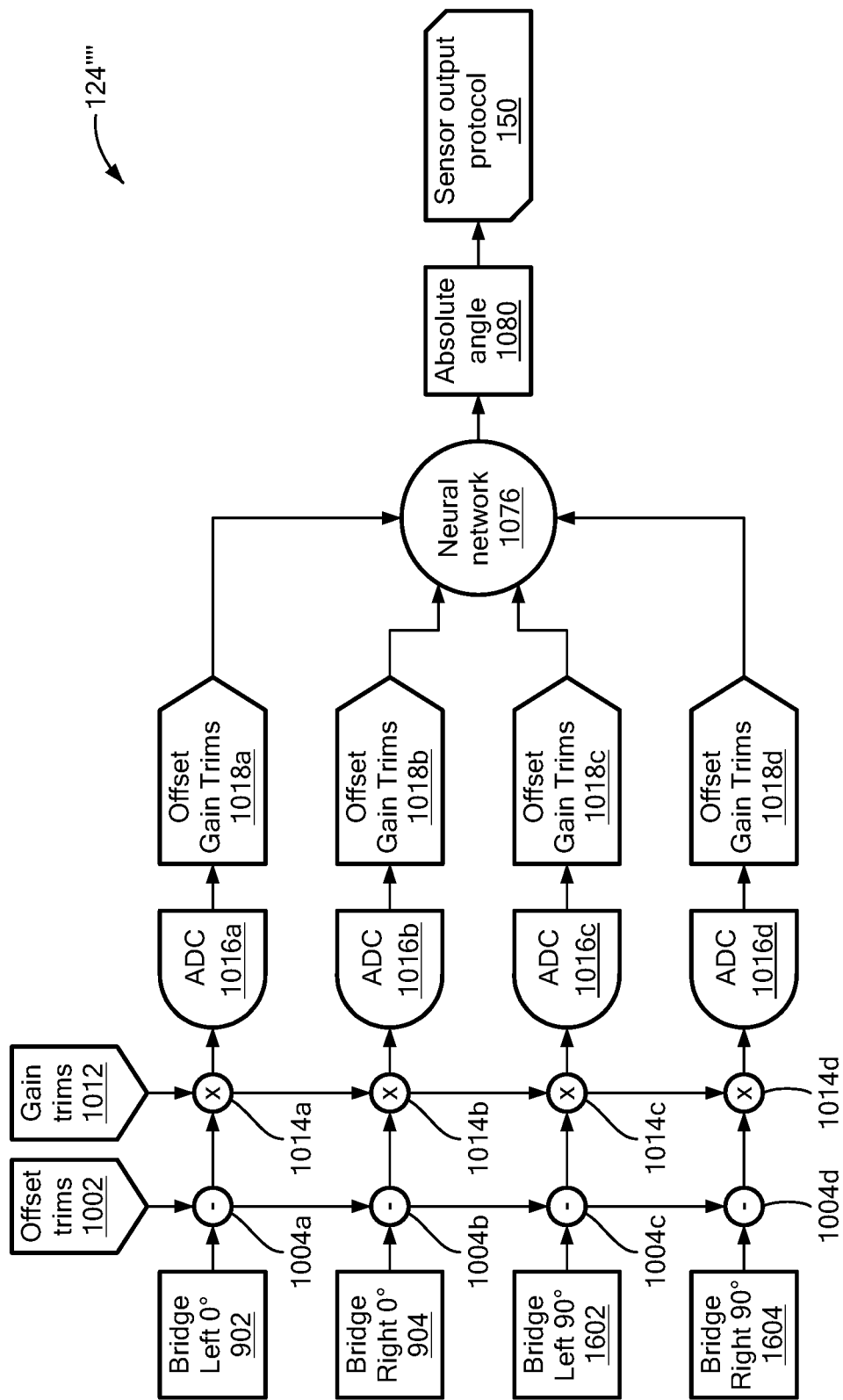
FIG. 18 is a block diagram of a still further example of processing circuitry.

Referring to FIG. 18, another example of the processing circuitry 124 (FIG. 1) is the processing circuitry 124''''. The processing circuitry 124'''' is the same as the processing circuitry 124' except the adders 1022a, 1022c; the subtractors 1022b, 1022d; the normalization circuits 1732, 1734; the divider 1040; the arctangent circuit 1036; the harmonic correction circuit 1062, 1064; and the absolute angle conversion circuit 1068 are replaced by the neural network circuit 1076. In one example, the neural network circuit 1076 is an MLP.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An angle sensor comprising:
magnetic-field sensing elements comprising:
a first pair of magnetic-field sensing elements,
a second pair of magnetic-field sensing elements;
a third pair of magnetic-field sensing elements;
a fourth pair of magnetic-field sensing elements; and
processing circuitry configured to determine an angle of a rotating ring magnet having a plurality of North-South pole pairs each having a unique period length, the processing circuitry comprises:
a first bridge formed from the first and second pairs of magnetic-field sensing elements; and
a second bridge formed from the third and fourth pairs of magnetic-field sensing elements;
wherein the angle includes a value from 0° to 360°,
wherein the first, second, third and fourth pairs of magnetic-field sensing elements are each disposed on a first axis,
wherein the first, second, third and fourth pairs of magnetic-field sensing elements each have a sensitivity in a first direction along the first axis,
wherein the angle sensor is formed on a single die,
wherein the angle sensor is an off-axis angle sensor or a side-shaft angle sensor,
wherein the first pair of magnetic-field sensing elements are on a first position on the first axis,
wherein the second pair of magnetic-field sensing elements are on a second position on the first axis,
wherein the third pair of magnetic-field sensing elements are on a third position on the first axis; and
wherein the fourth pair of magnetic-field sensing elements are on a fourth position on the first axis.

2. The angle sensor of claim 1, wherein the magnetic-field sensing elements further comprise:
a fifth pair of magnetic-field sensing elements;
a sixth pair of magnetic-field sensing elements;
a seventh pair of magnetic-field sensing elements; and
an eighth pair of magnetic-field sensing elements,
wherein the fifth, sixth, seventh and eighth pairs of magnetic-field sensing elements are each disposed on a second axis parallel to the first axis, and
wherein the fifth, sixth, seventh and eighth pairs of magnetic-field sensing elements each have a sensitivity in a second direction orthogonal to the first direction.

3. The angle sensor of claim 2, wherein the processing circuitry further comprises:
a third bridge formed from the fifth and sixth pairs of magnetic-field sensing elements; and
a fourth bridge formed from the seventh and eighth pairs of magnetic-field sensing elements.

4. The angle sensor of claim 3, wherein the processing circuitry determines a period index indicative of a North-South Pole pair in the ring magnet.

5. The angle sensor of claim 4, wherein the processing circuitry determines a local angle indicative of the angle with the North-South Pole pair corresponding to the determined period index.

6. The angle sensor of claim 5, wherein the processing circuitry generates the angle of a rotating ring magnetic using the period index and the local angle.

7. The angle sensor of claim 3, wherein the fifth pair of magnetic-field sensing elements are on a first position on the second axis,
wherein the sixth pair of magnetic-field sensing elements are on a second position on the second axis,
wherein the seventh pair of magnetic-field sensing elements are on a third position on the second axis; and
wherein the eighth pair of magnetic-field sensing elements are on a fourth position on the second axis.

8. The angle sensor of claim 1, wherein at least one magnetic-field sensing element of the magnetic-field sensing elements is a giant magnetoresistance (GMR) element, a tunneling magnetoresistance (TMR) element or a Hall element.

9. The angle sensor of claim 1, wherein the processing circuitry determines a period index indicative of a North-South Pole pair in the ring magnet.

10. The angle sensor of claim 9, wherein the processing circuitry determines a local angle indicative of the angle with the North-South Pole pair corresponding to the determined period index.

11. The angle sensor of claim 10, wherein the processing circuitry generates the angle of a rotating ring magnetic using the period index and the local angle.

12. An angle sensor system comprising:
a ring magnet having a plurality of North-South Pole pairs each having a unique period length,
an angle sensor comprising:
magnetic-field sensing elements comprising:
a first pair of magnetic-field sensing elements,
a second pair of magnetic-field sensing elements;
a third pair of magnetic-field sensing elements;
a fourth pair of magnetic-field sensing elements; and
processing circuitry configured to determine an angle of the ring magnet, the processing circuitry comprises:
a first bridge formed from the first and second pairs of magnetic-field sensing elements; and
a second bridge formed from the third and fourth pairs of magnetic-field sensing elements;
wherein the angle includes a value from 0° to 360°,
wherein the first, second, third and fourth pairs of magnetic-field sensing elements are each disposed on a first axis,
wherein the first, second, third and fourth pairs of magnetic-field sensing elements each have a sensitivity in a first direction along the first axis,
wherein the angle sensor is formed on a single die,
wherein the angle sensor is an off-axis angle sensor or a side-shaft angle sensor,
wherein the first pair of magnetic-field sensing elements are on a first position on the first axis,
wherein the second pair of magnetic-field sensing elements are on a second position on the first axis,
wherein the third pair of magnetic-field sensing elements are on a third position on the first axis; and
wherein the fourth pair of magnetic-field sensing elements are on a fourth position on the first axis.

13. The angle sensor system of claim 12, wherein the magnetic-field sensing elements further comprise:
a fifth pair of magnetic-field sensing elements;
a sixth pair of magnetic-field sensing elements;
a seventh pair of magnetic-field sensing elements; and
an eighth pair of magnetic-field sensing elements,
wherein the fifth, sixth, seventh and eighth pairs of magnetic-field sensing elements are each disposed on a second axis parallel to the first axis, and
wherein the fifth, sixth, seventh and eighth pairs of magnetic-field sensing elements each have a sensitivity in a second direction orthogonal to the first direction.

14. The angle sensor system of claim 13, wherein the processing circuitry further comprises:
   a third bridge formed from the fifth and sixth pairs of magnetic-field sensing elements; and
   a fourth bridge formed from the seventh and eighth pairs of magnetic-field sensing elements.

15. The angle sensor system of claim 14, wherein the processing circuitry determines a period index indicative of a North-South Pole pair in the ring magnet.

16. The angle sensor system of claim 15, wherein the processing circuitry determines a local angle indicative of the angle with the North-South Pole pair corresponding to the determined period index.

17. The angle sensor system of claim 16, wherein the processing circuitry generates the angle of a rotating ring magnetic using the period index and the local angle.

18. The angle sensor system of claim 14, wherein the fifth pair of magnetic-field sensing elements are on a first position on the second axis,
   wherein the sixth pair of magnetic-field sensing elements are on a second position on the second axis,
   wherein the seventh pair of magnetic-field sensing elements are on a third position on the second axis; and
   wherein the eighth pair of magnetic-field sensing elements are on a fourth position on the second axis.

19. The angle sensor system of claim 12, wherein at least one magnetic-field sensing element of the magnetic-field sensing elements is a giant magnetoresistance (GMR) element, a tunneling magnetoresistance (TMR) element or a Hall element.

20. The angle sensor system of claim 12, wherein the processing circuitry determines a period index indicative of a North-South Pole pair in the ring magnet.

21. The angle sensor system of claim 20, wherein the processing circuitry determines a local angle indicative of the angle with the North-South Pole pair corresponding to the determined period index.

22. The angle sensor system of claim 21, wherein the processing circuitry generates the angle of a rotating ring magnetic using the period index and the local angle.

* * * * *

UNITED STATES PATENT AND TRADEMARK OFFICE
CERTIFICATE OF CORRECTION

| | |
|---|---|
| PATENT NO. | : 11,719,527 B2 |
| APPLICATION NO. | : 17/453577 |
| DATED | : August 8, 2023 |
| INVENTOR(S) | : Rémy Lassalle-Balier |

It is certified that error appears in the above-identified patent and that said Letters Patent is hereby corrected as shown below:

In the Specification

Column 2, Line 67 delete "plurality North-" and replace with --plurality of North- --.

Column 3, Line 28 delete "102." and replace with --102'.--.

Column 4, Line 23 delete "element" and replace with --elements--.

Column 4, Line 27 delete "106'" and replace with --106"--.

Column 4, Line 61 delete "102'"." and replace with --102"".--.

Column 4, Line 62 delete "102""" and replace with --102""'--.

Column 5, Line 3 delete "a magnetic-field" and replace with --magnetic-field--.

Column 5, Line 63 delete "gains" and replace with --gain--.

Column 6, Line 3 delete "1024a." and replace with --1024b.--.

Column 6, Line 12 delete "1024a from" and replace with --1024b. from--.

Column 6, Line 23 delete "904," and replace with --902,--.

Column 6, Line 24 delete "902." and replace with --904.--.

Column 7, Line 10 delete "1402 are" and replace with --1400 are--.

Column 7, Line 21 delete "102" and replace with --100--.

Signed and Sealed this
Fifteenth Day of April, 2025

Coke Morgan Stewart
*Acting Director of the United States Patent and Trademark Office*

CERTIFICATE OF CORRECTION (continued)
U.S. Pat. No. 11,719,527 B2

Column 7, Line 23 delete "a magnetic-field" and replace with --magnetic-field--.

Column 7, Line 28 delete "includes include" and replace with --includes--.

Column 8, Line 20 delete "gains" and replace with --gain--.

Column 8, Line 26 delete "gains" and replace with --gain--.